(12) United States Patent
Ito et al.

(10) Patent No.: US 11,563,437 B2
(45) Date of Patent: Jan. 24, 2023

(54) INTEGRATED CIRCUIT APPARATUS AND OSCILLATOR

(71) Applicant: SEIKO EPSON CORPORATION, Tokyo (JP)

(72) Inventors: Hisahiro Ito, Minowa-machi (JP); Shoichiro Kasahara, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/580,968

(22) Filed: Jan. 21, 2022

(65) Prior Publication Data

US 2022/0239299 A1    Jul. 28, 2022

(30) Foreign Application Priority Data

Jan. 25, 2021    (JP) .............................. JP2021-009243

(51) Int. Cl.
*H03B 5/04*    (2006.01)
*H03L 7/099*    (2006.01)
*H03B 5/32*    (2006.01)
*H03L 7/093*    (2006.01)

(52) U.S. Cl.
CPC ............... *H03L 7/099* (2013.01); *H03B 5/04* (2013.01); *H03B 5/32* (2013.01); *H03L 7/093* (2013.01); *H03B 2200/0088* (2013.01)

(58) Field of Classification Search
CPC ................................. H03L 7/099; H03B 5/04
USPC .................................................. 331/143, 158
See application file for complete search history.

(56) References Cited

U.S. PATENT DOCUMENTS 9,484,926 B2 * 11/2016 Yamamoto ............... H03B 5/04
9,634,672 B2 *  4/2017 Yamamoto ............... H03B 5/04

FOREIGN PATENT DOCUMENTS

JP        2018-098428         6/2018

* cited by examiner

*Primary Examiner* — Joseph Chang
(74) *Attorney, Agent, or Firm* — Rankin, Hill & Clark LLP

(57) ABSTRACT

An integrated circuit apparatus includes an oscillation circuit that generates an oscillation signal by using a resonator, an output buffer circuit that outputs a clock signal based on the oscillation signal, a DC voltage generation circuit that generates a DC voltage used to generate the oscillation signal or the clock signal, a power source pad to which a power source voltage is supplied, a ground pad to which a ground voltage is supplied, and a clock pad via which the clock signal is outputted. The ground pad and the DC voltage generation circuit are disposed so as to overlap with each other in the plan view.

16 Claims, 12 Drawing Sheets

INTEGRATED CIRCUIT APPARATUS AND OSCILLATOR

The present application is based on, and claims priority from JP Application Serial Number 2021-009243, filed Jan. 25, 2021, the disclosure of which is hereby incorporated by reference herein in its entirety.

BACKGROUND

1. Technical Field

The present disclosure relates to an integrated circuit apparatus, an oscillator, and the like.

2. Related Art

There has been known integrated circuit apparatuses including oscillation circuits that cause resonators, such as crystal resonators, to oscillate. JP-A-2018-98428 discloses the layout of an integrated circuit apparatus including a temperature compensated oscillation circuit. JP-A-2018-98428, which discloses an integrated circuit apparatus used in an oscillator and including a temperature compensation circuit, describes, for example, that a power source line provided along the outer circumference of the integrated circuit apparatus has a discontinuous portion provided between the region of a clock signal output circuit and the region of a temperature compensation circuit so that propagation of power source noise is suppressed.

However, even when the propagation of the noise is suppressed by dividing the power source line as in JP-A-2018-98428, radiation noise is superimposed on DC voltage generated by a circuit provided around an output buffer circuit that outputs a clock signal, so that the noise resistance of the oscillator can deteriorate.

SUMMARY

An aspect of the present disclosure relates to an integrated circuit apparatus including an oscillation circuit that generates an oscillation signal by using a resonator, an output buffer circuit that outputs a clock signal based on the oscillation signal, a DC voltage generation circuit that generates a DC voltage used to generate the oscillation signal or the clock signal, a power source pad to which a power source voltage is supplied, a ground pad to which a ground voltage is supplied, and a clock pad via which the clock signal is outputted, and the ground pad and the DC voltage generation circuit are disposed so as to overlap with each other in a plan view.

Another aspect of the present disclosure relates to an oscillator including the integrated circuit apparatus described above and a resonator.

DESCRIPTION OF EXEMPLARY EMBODIMENTS

An embodiment of the present disclosure will be described below. It is not intended that the present embodiment described below unduly limits the contents described in the claims. Furthermore, all configurations described in the present embodiment are not necessarily essential configuration requirements of the present disclosure.

1. Integrated Circuit Apparatus

Figure 1:
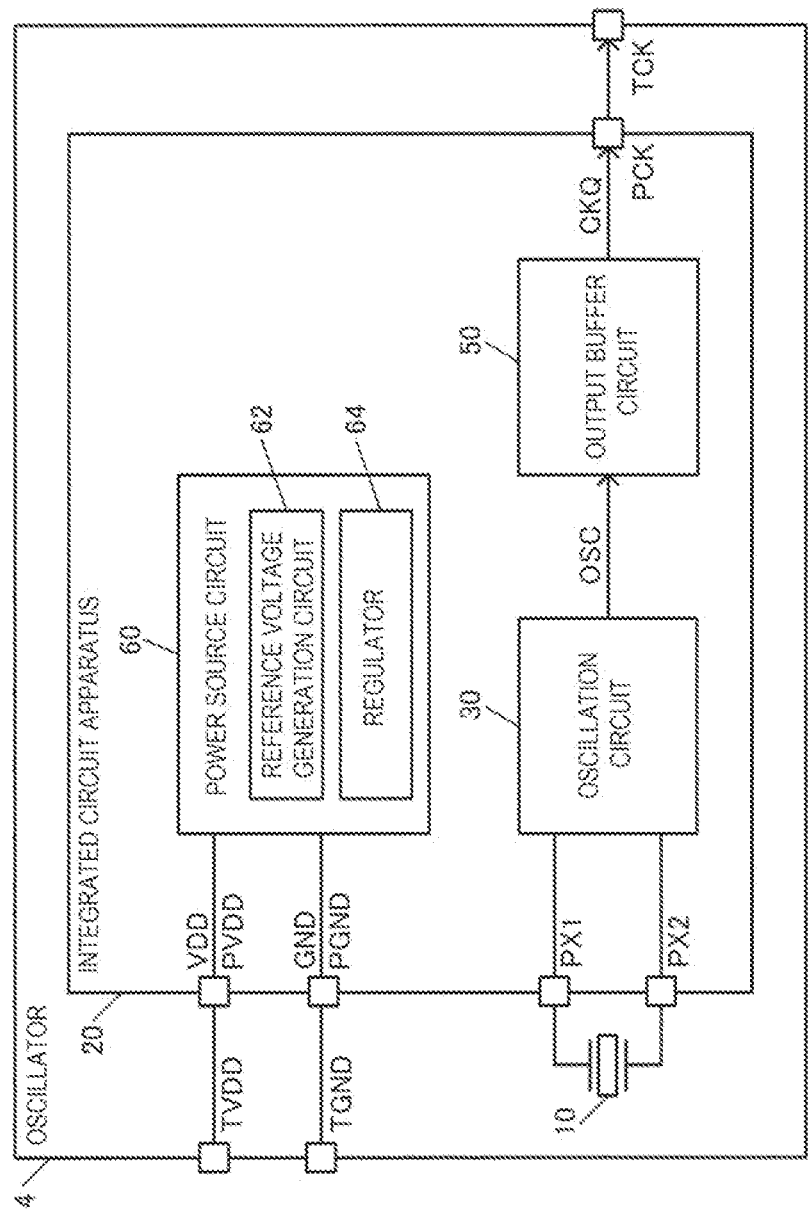
FIG. 1 shows an example of the configuration of an integrated circuit apparatus according to an embodiment of the present disclosure.
Figure 4:
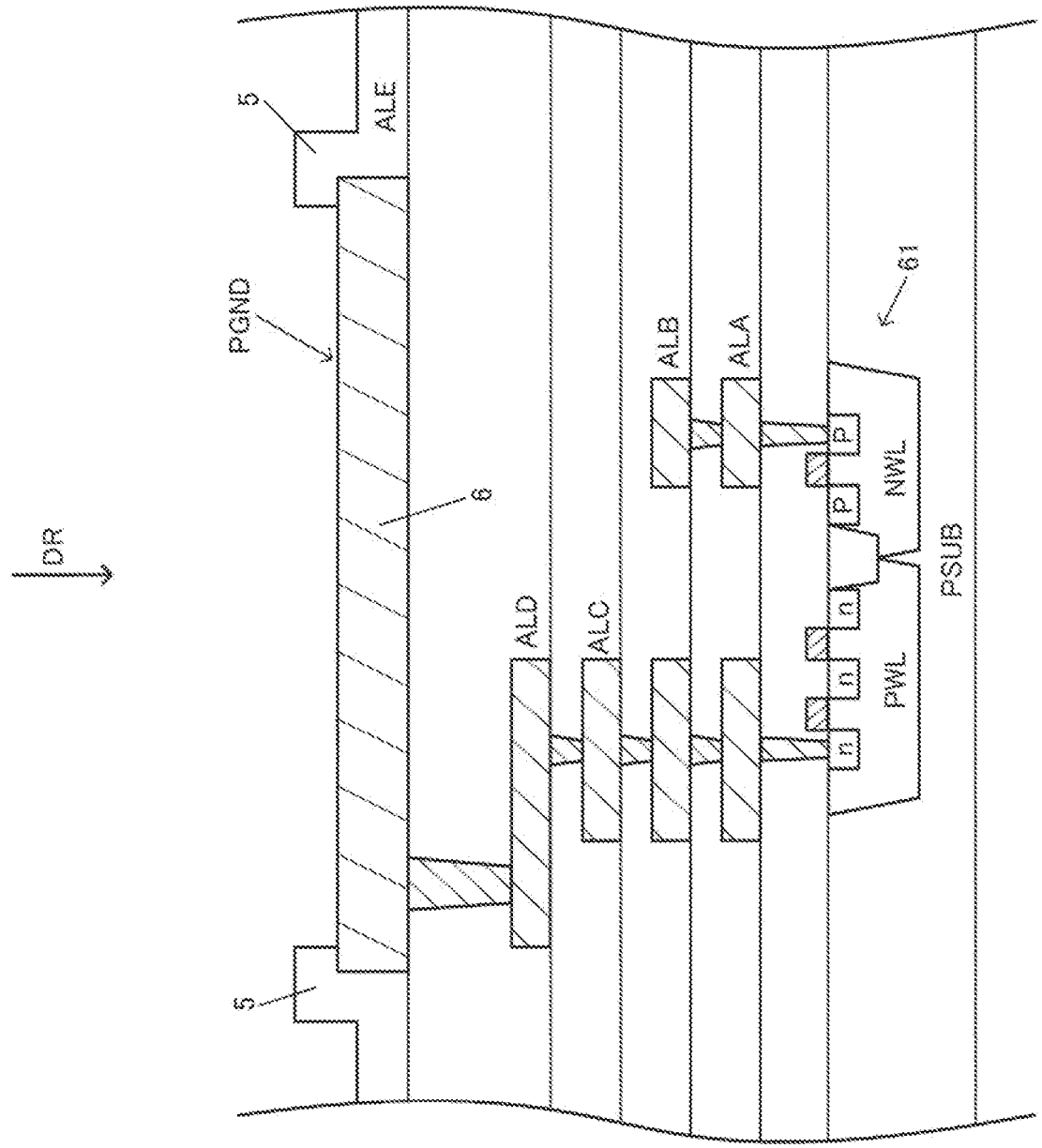
FIG. 4 is a cross-sectional view showing the arrangement of a ground pad and a DC voltage generation circuit.
Figure 5:
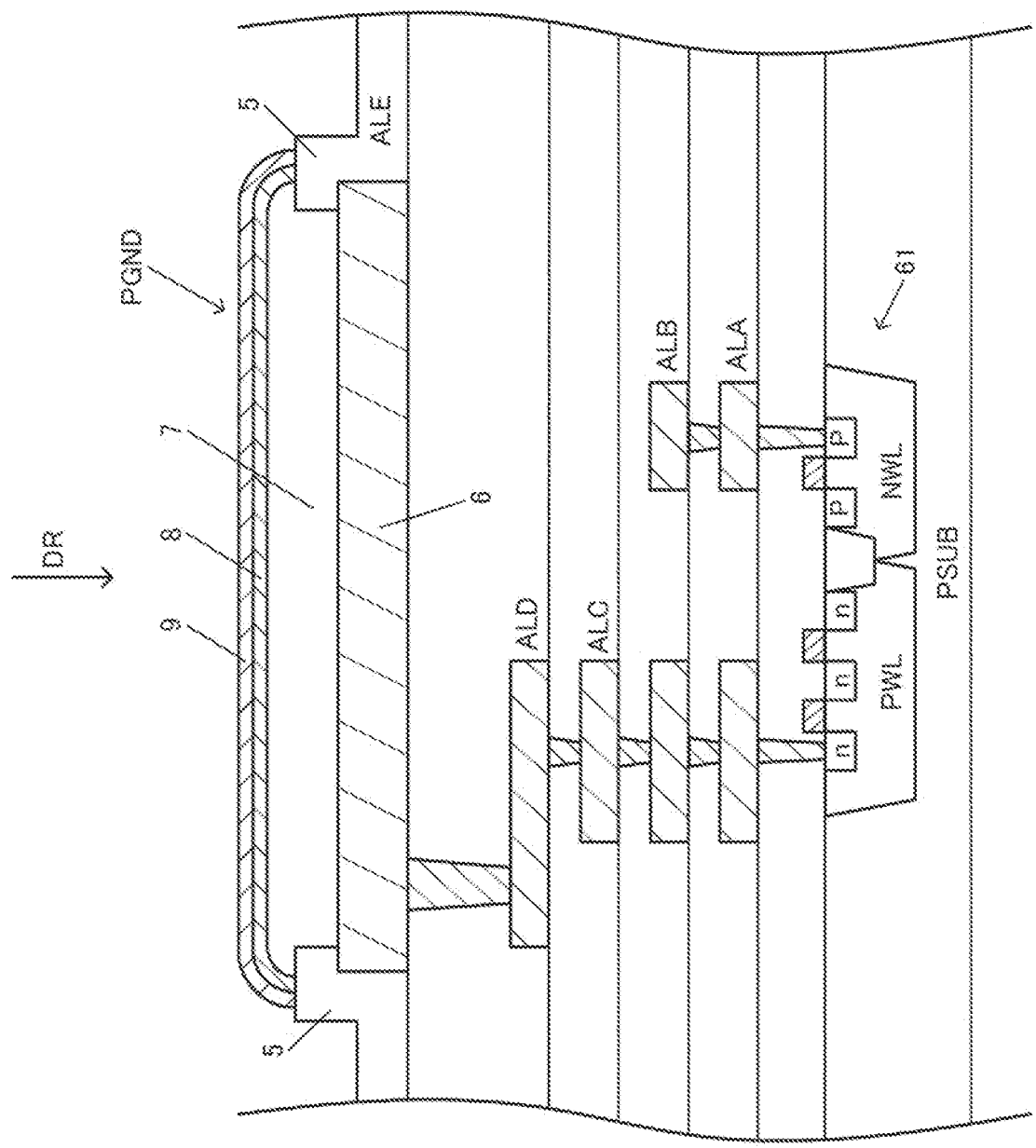
FIG. 5 is a cross-sectional view showing another example of the structure of the ground pad.

FIG. 1 shows an example of the configuration of an integrated circuit apparatus 20 according to the present embodiment. The integrated circuit apparatus 20 according to the present embodiment includes an oscillation circuit 30, an output buffer circuit 50, a power source pad PVDD, a ground pad PGND, and a clock pad PCK. The integrated circuit apparatus 20 can further include a power source circuit 60 and pads PX1 and PX2 for resonator coupling. For example, the integrated circuit apparatus 20 includes a reference voltage generation circuit 62 and a regulator 64 as a DC voltage generation circuit 61, which are shown in FIGS. 4 and 5 and will be described later. In FIG. 1, the reference voltage generation circuit 62 and the regulator 64, which form the DC voltage generation circuit 61, are provided in the power source circuit 60. An oscillator 4 according to the present embodiment includes a resonator 10 and the integrated circuit apparatus 20. The resonator 10 is electrically coupled to the integrated circuit apparatus 20. The resonator 10 and the integrated circuit apparatus 20 are electrically coupled to each other, for example, by using internal wiring, bonding wires, or metal bumps in a package that accommodates the resonator 10 and the integrated circuit apparatus 20.

The resonator 10 is an element that produces mechanical vibration in response to an electric signal. The resonator 10 can be achieved by a resonator element, for example, a quartz crystal resonator element. The resonator 10 can be achieved, for example, by a resonator that is cut at an AT or SC cut angle and undergoes thickness slide resonance, such as a quartz crystal resonator element, a tuning-fork-type quartz crystal resonator element, or a double tuning-fork-type quartz crystal resonator element. For example, the resonator 10 may be a resonator built in a temperature compensated crystal oscillator (TCXO) including no thermostatic chamber or a resonator built in an oven-controlled crystal oscillator (OCXO) including a thermostatic chamber.

The resonator 10 may instead be a resonator built in a simple packaged crystal oscillator (SPXO). The resonator 10 in the present embodiment can also be achieved by any of a variety of other resonator elements, for example, a resonator element other than the thickness slide resonance type, the tuning fork type, or the double tuning fork type and a piezoelectric resonator element made of a material other than quartz crystal. For example, a SAW (surface acoustic wave) resonator or a MEMS (micro electro mechanical systems) resonator in the form of a silicon resonator formed by using a silicon substrate may be employed as the resonator 10.

The integrated circuit apparatus 20 is an IC (integrated circuit) manufactured, for example, in a semiconductor process and is a semiconductor chip in which circuit elements are formed on a semiconductor substrate. In FIG. 1, the integrated circuit apparatus 20 includes the oscillation circuit 30, the output buffer circuit 50, and the power source circuit 60.

The oscillation circuit 30 is a circuit that causes the resonator 10 to oscillate. For example, the oscillation circuit 30 is electrically coupled to the pads PX1 and PX2 and generates an oscillation signal OSC by causing the resonator 10 to oscillate. The pad PX1 is a first pad, and the pad PX2 is a second pad. For example, the oscillation circuit 30 can be achieved by a drive circuit, which is provided between the pads PX1 and PX2 and passive elements, such as capacitors and resistors. The drive circuit can be achieved, for example, by a CMOS inverter circuit or a bipolar transistor. The drive circuit is a core circuit of the oscillation circuit 30 and causes the resonator 10 to oscillate by driving the resonator 10 with voltage or current. The oscillation circuit 30 can be any of a variety of types of oscillation circuit, such as an inverter-type oscillation circuit, a Pierce-type oscillation circuit, a Colpitts-type oscillation circuit, and a Hartley-type oscillation circuit. The oscillation circuit 30 is provided with a variable capacitance circuit, and the oscillation frequency of the oscillation circuit 30 can be adjusted by adjusting the capacitance of the variable capacitance circuit. The variable capacitance circuit can be achieved, for example, by a variable capacitance element, such as a varactor. The variable capacitance circuit can be achieved, for example, by a variable capacitance element having capacitance controlled based on a temperature compensated voltage. Instead, the variable capacitance circuit may be achieved by a capacitor array and a switch array coupled to the capacitor array. For example, the variable capacitance circuit may be formed of the following two arrays: a capacitor array including a plurality of capacitors having binary-weighted capacitance values; and a switch array including a plurality of switches that each turn on and off the coupling between the corresponding capacitor of the capacitor array and a ground node. It is noted that the coupling in the present embodiment is electrical coupling. The electrical coupling is coupling that allows transmission of an electric signal and hence transmission of information in the form of the electric signal. The electrical coupling may be coupling, for example, via a passive element.

The output buffer circuit 50 outputs a clock signal CKQ based on the oscillation signal OSC. For example, the output buffer circuit 50 buffers the oscillation signal OSC and outputs the buffered oscillation signal OSC as the clock signal CKQ to the clock pad PCK. The clock signal CKQ is then outputted out of the oscillator 4 via an external terminal TCK of the oscillator 4. For example, the output buffer circuit 50 outputs the clock signal CKQ in the form of a single-ended CMOS signal. The output buffer circuit 50 may output the clock signal CKQ in the form of a non-CMOS signal. The output buffer circuit 50 may output, for example, differential clock signals in a signal format, such as LVDS (low voltage differential signaling), PECL (positive emitter coupled logic), HCSL (high speed current steering logic), or differential CMOS (complementary MOS), to a component outside the oscillator 4.

A power source voltage VDD via the power source pad PVDD and a ground voltage via the ground pad PGND are supplied to the power source circuit 60, which then supplies the internal circuits of the integrated circuit apparatus 20 with a variety of power source voltages for the internal circuits. For example, the power source circuit 60 supplies the oscillation circuit 30 and other components with regulated power source voltages based on the power source voltage VDD, as will be described later. The power source circuit 60 includes the reference voltage generation circuit and the regulator 64, which form the DC voltage generation circuits 61 in FIGS. 4 and 5. The reference voltage generation circuit 62 generates and outputs a reference voltage. The reference voltage generation circuit 62 generates a reference voltage that is, for example, a constant voltage even if the power source voltage VDD or the temperature changes. For example, the reference voltage generation circuit 62 generates a reference voltage for generating at least one of bias currents, bias voltages, and the regulated power source voltages. For example, the integrated circuit apparatus 20 includes analog circuits, and the reference voltage generation circuit 62 generates the reference voltage for generating a bias current or a bias voltage for the analog circuits. The power source voltage VDD is supplied to the regulator 64, which then generates a variety of regulated power source voltages. For example, the regulator 64 generates a constant regulated power source voltage that is a stepped-down power source voltage VDD based on the reference voltage generated by the reference voltage generation circuit 62 and supplies each circuit block of the integrated circuit apparatus 20 with the generated regulated power source voltage. The reference voltage generation circuit 62 can be achieved, for example, by a bandgap reference circuit, a circuit using a gate work function difference, or a circuit using a threshold voltage difference that occurs when a channel impurity concentration is changed.

The integrated circuit apparatus 20 further includes the power source pad PVDD, the ground pad PGND, the clock pad PCK, and the pads PX1 and PX2 for resonator coupling. The pads described above are, for example, terminals of the integrated circuit apparatus 20, which is a semiconductor chip. In the region of each of the pads, for example, a metal layer is exposed via a passivation film, which is an insulating layer, and the exposed metal layer forms a pad of the integrated circuit apparatus 20. The power source pad PVDD is a pad to which the power source voltage VDD is inputted. For example, the power source voltage VDD from an external power source supply device is supplied to the power source pad PVDD. The ground pad PGND is a terminal to which GND, which is the ground voltage, is supplied. GND can also be called VSS, and the ground voltage is, for example, a ground potential. In the present embodiment, the ground is referred to as GND as appropriate. The clock pad PCK is a pad via which the clock signal CKQ is outputted. For example, the clock signal CKQ based on the oscillation signal OSC from the oscillation circuit 30 is outputted via the clock pad PCK out of the oscillator 4. The power source pad PVDD, the ground pad PGND, and the clock pad PCK are electrically coupled to external terminals TVDD, TGND, and TCK of the oscillator 4, respectively, for external coupling. The electrical coupling is, for example, made by using the internal wiring, bonding wires, or metal bumps in the package. The external terminals TVDD, TGND, and TCK of the oscillator 4 are then electrically coupled to an external device. The pads PX1 and PX2 are pads to which the resonator 10 is coupled. For example, the pad PX1 is electrically coupled to one end of the resonator 10, and the pad PX2 is electrically coupled to the other end of the resonator 10. For example, the resonator 10 is electrically coupled to the pads PX1 and PX2 of the integrated circuit apparatus 20 by using the internal wiring, bonding wires, or metal bumps in the package that accommodates the resonator 10 and the integrated circuit apparatus 20.

Figure 2:
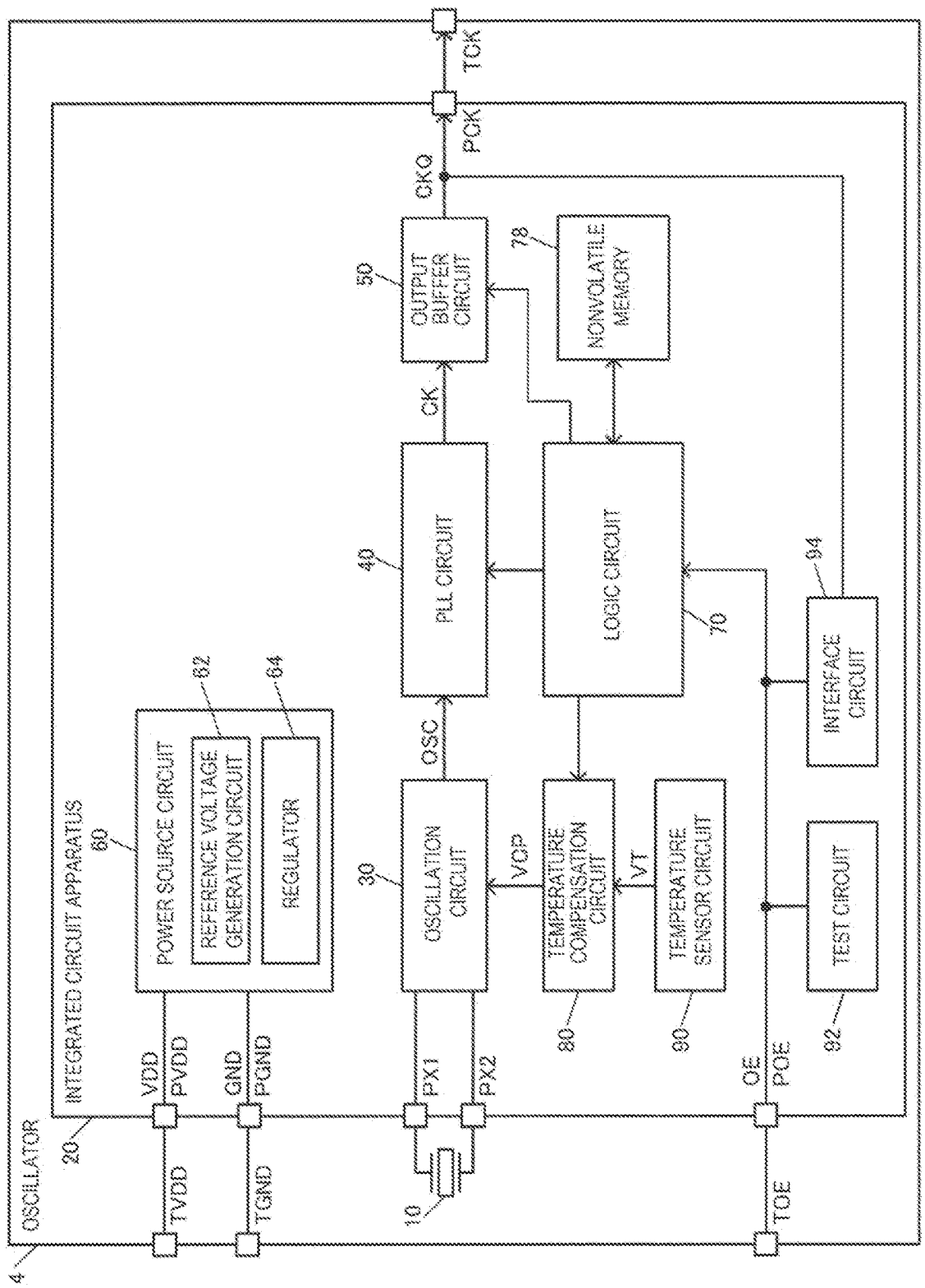
FIG. 2 shows an example of a detailed configuration of the integrated circuit apparatus according to the embodiment.

FIG. 2 shows an example of a detailed configuration of the integrated circuit apparatus 20 according to the present embodiment. In addition to the circuit blocks shown in FIG. 1, the integrated circuit apparatus 20 in FIG. 2 includes a PLL circuit 40, a logic circuit 70, a nonvolatile memory 78, a temperature compensation circuit 80, a temperature sensor circuit 90, a test circuit 92, and an interface circuit 94. In addition to the pads shown in FIG. 1, the integrated circuit apparatus 20 includes an output enable pad POE.

The PLL circuit 40 performs a PLL operation of generating the clock signal CKQ phase-locked to the oscillation signal OSC. For example, the PLL circuit 40 receives the oscillation signal OSC, which is an oscillation clock signal from the oscillation circuit 30, and outputs the clock signal CK phase-locked to the oscillation signal OSC. Specifically, the PLL circuit 40 outputs the clock signal CK phase-locked to the oscillation signal OSC and having a frequency that is a multiple of the frequency of the oscillation signal OSC. The clock signal CK from the PLL circuit 40 is then input to the output buffer circuit 50, which then outputs the clock signal CKQ. That is, the output buffer circuit 50 buffers the clock signal CK based on the oscillation signal OSC and outputs the buffered clock signal CK as the clock signal CKQ. The PLL circuit 40 will be described later in details.

The logic circuit 70 is a control circuit and performs a variety of types of control. For example, the logic circuit 70 controls the entire integrated circuit apparatus 20 and controls the operation sequence of the integrated circuit apparatus 20. For example, the logic circuit 70 controls each circuit block of the integrated circuit apparatus 20, such as the oscillation circuit 30, the output buffer circuit 50, the power source circuit 60, and the temperature compensation circuit 80. The logic circuit 70 further controls the operation of writing information to the nonvolatile memory 78 and reading information therefrom. The logic circuit 70 can be achieved, for example, by an ASIC (application specific integrated circuit) produced by automatically placed wiring, such as a gate array.

The nonvolatile memory 78 stores a variety of pieces of information used in the integrated circuit apparatus 20. The nonvolatile memory 78 can be achieved by an EEPROM, such as a FAMOS (floating gate avalanche injection MOS) memory or a MONOS (metal-oxide-nitride-oxide-silicon) memory, but not necessarily, and may, for example, be an OTP (one time programmable) memory or a fuse-type ROM.

The temperature compensation circuit 80 performs temperature compensation on the oscillation signal OSC from the oscillation circuit 30. The temperature compensation of the oscillation signal OSC is temperature compensation of the oscillation frequency of the oscillation circuit 30. Specifically, the temperature compensation circuit 80 performs the temperature compensation based on temperature detection information from the temperature sensor circuit 90. For example, the temperature compensation circuit 80 performs the temperature compensation on the oscillation signal OSC from the oscillation circuit 30 by generating temperature compensated voltage VCP based on a temperature detection voltage VT from the temperature sensor circuit 90 and outputting the generated temperature compensated voltage VCP to the oscillation circuit 30. For example, the temperature compensation circuit 80 performs the temperature compensation by outputting the temperature compensated voltage VCP, which is the voltage that controls the capacitance of the variable capacitance circuit provided in the oscillation circuit 30, to the variable capacitance circuit. In this case, the variable capacitance circuit in the oscillation circuit 30 is achieved by a variable capacitance element, such as a varactor. The temperature compensation is the process of suppressing variation in the oscillation frequency caused by variation in the temperature to compensate for the variation in the oscillation frequency. For example, the temperature compensation circuit 80 performs analog temperature compensation using polynomial approximation. For example, when a temperature compensation voltage that compensates for variation in the frequency-temperature characteristics of the resonator 10 is approximately expressed by a polynomial, the temperature compensation circuit 80 performs analog temperature compensation based on information on the coefficients of the polynomial. The analog temperature compensation is temperature compensation achieved, for example, by addition of a current or voltage signal, which is an analog signal. Specifically, the nonvolatile memory 78 stores the information on the coefficients of the polynomial for the temperature compensation, and the logic circuit 70 reads the coefficient information from the nonvolatile memory 78 and sets the coefficient information, for example, in a register of the temperature compensation circuit 80. The temperature compensation circuit 80 then performs the analog temperature compensation based on the coefficient information set in the register. The temperature compensation circuit 80 may perform digital temperature compensation. In this case, the temperature compensation circuit 80 is achieved, for example, by a logic circuit. Specifically, the temperature compensation circuit 80 performs the digital temperature compensation based on temperature detection data that is the temperature detection information from the temperature sensor circuit 90. For example, the temperature compensation circuit 80 determines frequency adjustment data based on the temperature detection data. The capacitance value of the variable capacitance circuit of the oscillation circuit 30 is then adjusted based on the determined frequency adjustment data, whereby the temperature compensation is performed on the oscillation frequency of the oscillation circuit 30. In this case, the variable capacitance circuit of the oscillation circuit 30 is achieved by a capacitor array and a switch array, the former including a plurality of binary-weighted capacitors. The nonvolatile memory 78 stores a lookup table representing the correspondence between the temperature detection data and the frequency adjustment data, and the temperature compensation circuit 80 uses the lookup table read by the logic circuit 70 from the nonvolatile memory 78 to perform the temperature compensation process of determining the frequency adjustment data from the temperature data.

The temperature sensor circuit 90 is a sensor circuit that detects the temperature. Specifically, the temperature sensor circuit 90 outputs the temperature detection voltage VT in the form of a temperature dependent voltage that changes in accordance with the ambient temperature. For example, the temperature sensor circuit 90 uses a circuit element having a temperature dependence to generate the temperature detection voltage VT. Specifically, the temperature sensor circuit 90 uses the temperature dependence of the forward voltage of a PN junction to output the temperature detection voltage VT, which changes depending on the temperature. The forward voltage of a PN junction can, for example, be the base-emitter voltage of a bipolar transistor. To perform the digital temperature compensation, the temperature sensor circuit 90 measures the temperature, such as the ambient temperature, and outputs the result of the measurement as the temperature detection data. The temperature detection data is, for example, data that monotonously increases or decreases with respect to the temperature. The temperature sensor circuit 90 in this case can be a temperature sensor circuit that utilizes the fact that the oscillation frequency of a ring oscillator has temperature dependence. Specifically, the temperature sensor circuit 90 includes a ring oscillator and a counter circuit. The counter circuit counts an output pulse signal that is the oscillation signal from the ring oscillator over a counting period of time specified by the clock signal based on the oscillation signal OSC from the oscillation circuit 30 and outputs the count as the temperature detection data.

The output enable pad POE is a pad for controlling whether the output of the clock signal CKQ is enabled. Specifically, whether the output of the clock signal CKQ is enabled is controlled based on an output enable signal OE, which is inputted via the output enable pad POE. The output enable pad POE is electrically coupled to an external terminal TOE for external coupling of the oscillator 4. For example, the logic circuit 70 receives an output enable signal OE via the output enable pad POE and controls whether the output buffer circuit 50 enables the output of the clock signal CKQ. For example, when the output enable signal OE is active, the output buffer circuit 50 outputs the clock signal CKQ. On the other hand, when the output enable signal OE is inactive, the clock signal CKQ is set at a fixed voltage level, for example, the low level. The state in which a signal is active means, for example, that the signal has the high level in the case of positive logic and has the low level in the case of negative logic. The state in which a signal is inactive means that the signal has the low level in the case of positive logic and has the high level in the case of negative logic.

The test circuit 92 is a circuit for testing the integrated circuit apparatus 20. The test circuit 92 is used to the analog circuits and other test circuit blocks of the integrated circuit apparatus 20. The interface circuit 94 is, for example, a circuit for serial interface communication. For example, in a test mode or any other mode, the clock pad PCK serves as a serial clock signal input terminal, and the output enable pad POE serves as a serial data input/output terminal. The interface circuit then performs serial interface communication for capturing serial data and outputting serial data in synchronization with the serial clock signal. The interface circuit 94 can be achieved by a serial interface circuit, such as an SPI (serial peripheral interface) circuit and an I2C (inter-integrated circuit). Using the thus configured interface circuit 94 allows, for example, information used for the temperature compensation to be written to the nonvolatile memory 78.

Figure 3:
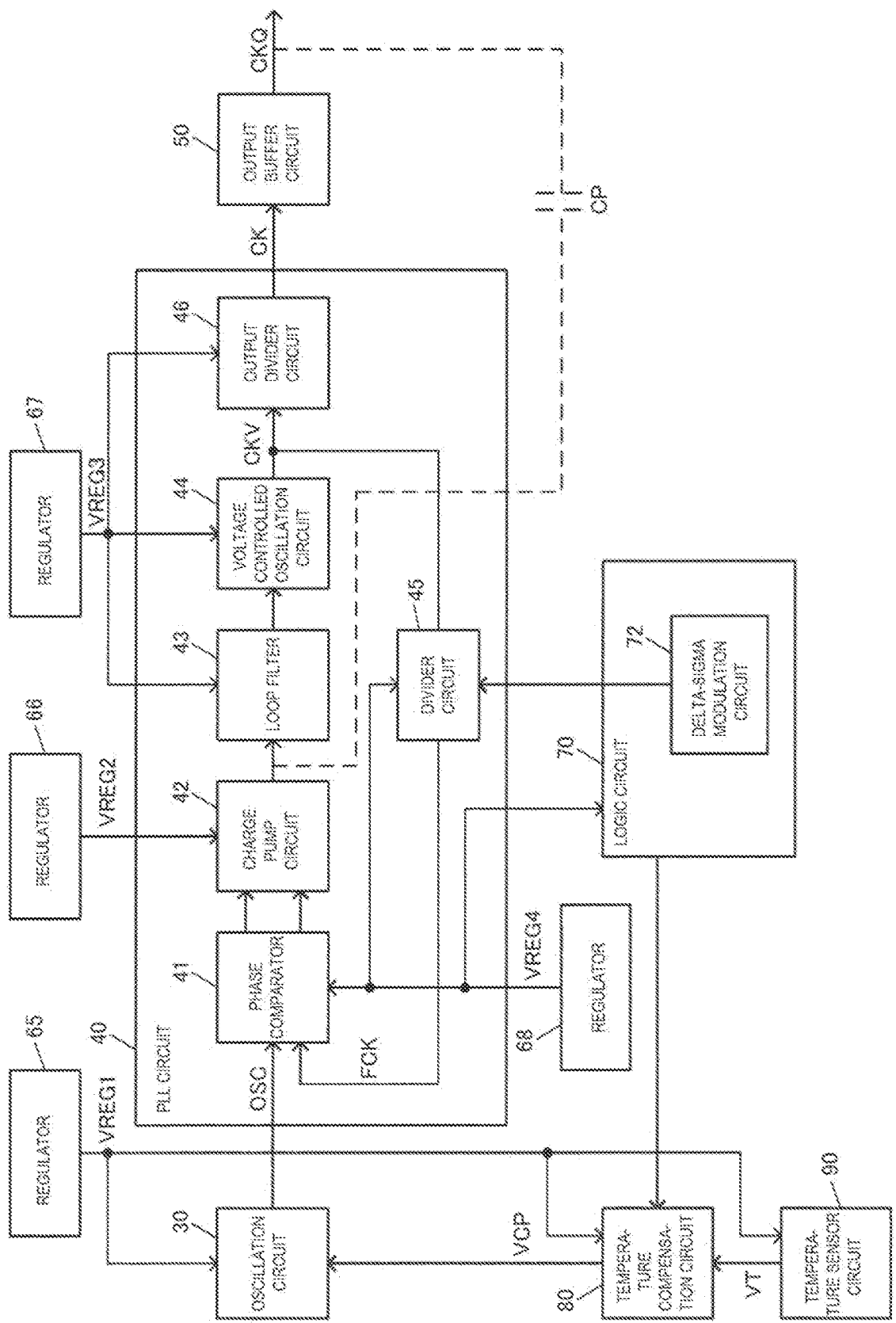
FIG. 3 shows an example of the detailed configuration of a PLL circuit.

FIG. 3 shows an example of the detailed configuration of the PLL circuit 40. In FIG. 3, the PLL circuit 40 is a fractional-N PLL circuit capable of multiplying the frequency of the oscillation signal OSC by a fraction.

The PLL circuit 40 includes a phase comparator 41, a charge pump circuit 42, a loop filter 43, a voltage controlled oscillation circuit 44, a divider circuit 45, and an output divider circuit 46. The logic circuit 70 includes a delta-sigma modulation circuit 72.

The phase comparator 41 of the PLL circuit 40 compares the phase of the oscillation signal OSC, which is a reference clock signal, with the phase of a feedback clock signal FCK from the divider circuit 45 and outputs a phase comparison result signal. The phase comparison result signal is a signal according to the phase difference between the oscillation signal OSC and the feedback clock signal FCK. Specifically, the phase comparator 41 outputs an up signal or a down signal as the phase comparison result signal. The charge pump circuit 42 converts the phase comparison result signal, which is the up or down signal, from the phase comparator 41 into an output current. That is, the charge pump circuit 42 converts the up and down signals, which are each a rectangular voltage pulse, into the output current, which is a rectangular current pulse. For example, the charge pump circuit 42 outputs a positive current pulse when the up signal is inputted and a negative current pulse when the down signal is inputted. The loop filter 43 smoothens the signal outputted from the charge pump circuit 42 to generate a control voltage that controls the oscillation frequency of the voltage controlled oscillation circuit 44 and outputs the control voltage to the voltage controlled oscillation circuit 44. Specifically, the loop filter 43 converts the output current from the charge pump circuit 42 into a current voltage and performs filtering on the output voltage. The control voltage, which is the output voltage from the loop filter 43, for example, rises when the up signal is outputted and falls when the down signal is outputted. The loop filter 43 can be achieved, for example, by a third- or fourth-order RC filter. That is, the loop filter 43 can be achieved by a passive RC filter using a resistor and a capacitor. The loop filter 43 can instead be a passive filter using an inductor as the passive element. When the control voltage from the loop filter 43 is then inputted to the voltage controlled oscillation circuit 44, the capacitance of the variable capacitance element achieved, for example, by a varactor changes, so that the oscillation frequency of the voltage controlled oscillation circuit 44, which is VCO, is controlled. A clock signal CKV having a frequency set by the control voltage is then outputted to the divider circuit 45. The voltage controlled oscillation circuit 44, specifically, for example, a resonant circuit using an inductor generates the clock signal CKV.

In the present embodiment, the divider 45 and the delta-sigma modulation circuit 72 form a fractional divider. The fractional divider divides the clock signal CKV by using the inverse of the multiplication factor of the PLL circuit as the division ratio and outputs the divided clock signal as the feedback clock signal FCK to the phase comparator 41. The delta-sigma modulation circuit 72 generates a modulated value that is an integer by delta-sigma modulating the value of the fractional part of the division ratio. For example, the delta-sigma modulation circuit 72 performs third- or fourth-order delta-sigma modulation. The value of the integer part of the division ratio and the modulated value are then added to each other, and the result of the addition is set as the set value of the division ratio in the divider circuit 45. The fractional-N PLL circuit 40 is thus achieved. The PLL circuit 40 is provided with the output divider circuit 46, which divides the clock signal CKV from the voltage controlled oscillation circuit 44 and outputs the divided signal as the clock signal CK to the output buffer circuit 50. The output buffer circuit 50 then buffers the clock signal CK and outputs the buffered clock signal CK as the clock signal CKQ. A variation in which no output divider circuit 46 is provided is also conceivable.

In FIG. 3, regulators 65, 66, 67, and 68 are provided as the regulator 64 shown in FIGS. 1 and 2. The regulator 65 generates a regulated power source voltage VREG1 and supplies the oscillation circuit 30, the temperature compensation circuit 80, and the temperature sensor circuit 90 with the regulated power source voltage VREG1. The regulator 66 generates a regulated power source voltage VREG2 and supplies the charge pump circuit 42 of the PLL circuit 40 with the regulated power source voltage VREG2. The regulator 67 generates the regulated power source voltage VREG3 and supplies the loop filter 43, the voltage controlled oscillation circuit 44, and the output divider circuit 46 of the PLL circuit 40 with the regulated power source voltage VREG3. The regulator 68 generates a regulated power source voltage VREG4 and supplies the logic circuit 70, the phase comparator 41 of the PLL circuit 40, and the divider circuit 45 with the regulated power source voltage VREG4. For example, in the voltage controlled oscillation circuit 44, the output divider circuit 46, and other components, high-frequency noise due to the clock signals is produced, and in the logic circuit 70 and other components, high-frequency noise due to logic operations is produced. Therefore, the circuits described above are operated by the regulated power source voltage VREG3 from the regulator 67 or the regulated power source voltage VREG4 from the regulator 68, whereas the oscillation circuit 30, the charge pump circuit 42, and other components are operated by the regulated power source voltage VREG1 from the regulator 65 or the regulated power source voltage VREG2 from the regulator 66. Transmission of the high-frequency noise produced by the clock signals, the logic operations, and other factors to the oscillation circuit 30, the charge pump circuit 42, the temperature compensation circuit 80, and other components is thus suppressed, whereby a decrease in the accuracy of the clock frequency caused by the high-frequency noise can be prevented.

As described above, the integrated circuit apparatus 20 according to the present embodiment includes the oscillation circuit 30, which generates the oscillation signal OSC by using the resonator 10, the output buffer circuit 50, which outputs the clock signal CKQ based on the oscillation signal OSC, the power source pad PVDD, the ground pad PGND, and the clock pad PCK. The integrated circuit apparatus 20 further includes the DC voltage generation circuit 61, which generates a DC voltage used to generate the oscillation signal OSC or the clock signal CKQ, such as the reference voltage generation circuit 62 and the regulator 64. The regulator 64 is, for example, the regulators 65, 66, 67, and 68 shown in FIG. 3.

In the thus configured integrated circuit apparatus 20, it has been found that electromagnetic and electrostatic coupling of the output buffer circuit 50 and the clock pad PCK to the DC voltage generation circuit 61, such as the reference voltage generation circuit 62 and the regulator 64, causes the high-frequency noise to be transmitted to the DC voltage generation circuit 61, resulting in a problem of a decrease in the accuracy of the clock frequency. Specifically, the integrated circuit apparatus 20 generates the oscillation signal OSC and the clock signal CKQ based on a DC voltage, such as the reference voltage and the regulated power source voltages outputted by the DC voltage generation circuit 61. The high-frequency noise, when superimposed on the DC voltage, therefore causes a decrease in the accuracy of the oscillation frequency in the oscillation circuit 30 and in turn a decrease in the accuracy of the clock frequency, a decrease in the accuracy of the clock frequencies of the clock signals generated in the PLL circuit 40 and other components, and other problems.

On the other hand, the ratio of the pad area to the total area of the integrated circuit apparatus 20 has been increasing in recent years. In the integrated circuit apparatus 20 used in the oscillator 4, no active circuit is disposed below any of the pads, so that the locations where the pads are disposed form dead spaces in the integrated circuit apparatus 20. Therefore, when the ratio of the pad area to the total area of the integrated circuit apparatus 20 increases, the dead spaces created by the pads increase and prevent reduction in the size of the integrated circuit apparatus 20. On the other hand, reducing the area of each of the pads to reduce the dead spaces created by the pads results in a difficulty performing flip mounting or bonding wire mounting, which will be described later. Therefore, to achieve stable mounting, a dead space reduction approach based on further reduction in the area of the pads cannot be employed.

When the DC voltage generation circuit 61, such as the reference voltage generation circuit 62 and the regulator 64, is separate from the ground pad PGND by a large distance, and ground wiring is shared between the DC voltage generation circuit 61 and other circuits, the impedance of the finite ground wiring undesirably causes potential fluctuation in the DC voltage outputted by the DC voltage generation circuit 61. For example, potential fluctuation occurs in the reference voltage and the regulated power source voltage outputted by the reference voltage generation circuit 62 or the regulator 64, which forms the DC voltage generation circuit 61. As described above, when potential fluctuation occurs in the DC voltage, such as the reference voltage or the regulated power source voltage, the accuracy of the frequency of the clock signal generated based on the DC voltage undesirably decreases.

To solve the problem described above, in the present embodiment, the ground pad PGND and the DC voltage generation circuit 61 are disposed so as to overlap with each other in the plan view, as shown in FIG. 4. Specifically, the ground pad PGND and the DC voltage generation circuit 61 are disposed so as to overlap with each other in the plan view in a direction DR in FIG. 4. For example, the DC voltage generation circuit 61 is disposed on the side facing in the direction DR or below the ground pad PGND. The direction DR is, for example, perpendicular to a substrate PSUB, which is a semiconductor substrate of the integrated circuit apparatus 20. It is noted that all the circuit portion of the DC voltage generation circuit 61 does not necessarily fall within the ground pad PGND in the plan view. For example, a layout in which part of the DC voltage generation circuit 61 does not fall within the ground pad PGND may be employed.

FIG. 4 is a cross-sectional view showing the arrangement of the ground pad PGND and the DC voltage generation circuit 61. The integrated circuit apparatus 20 has a wiring structure formed of five metal layers ALA to ALE made, for example, of aluminum, and a pad metal 6 is formed of the uppermost metal layer ALE. Specifically, the pad metal 6 is exposed in the opening of a pad region through a passivation film 5, allowing flip mounting or bonding wire mounting, which will be described later. A P-type well PWL and an N-type well NWL are formed in the P-type substrate PSUB. An N-type transistor that forms the DC voltage generation circuit 61 is formed in the P-type well PWL, and a P-type transistor is formed in the N-type well NWL. FIG. 4 diagrammatically shows the arrangement of the ground pad PGND and the DC voltage generation circuit 61. In practice, the layout area of transistors is sufficiently small relative to the layout area of the ground pad PGND, and a necessary number of transistors for the configuration of the DC voltage generation circuit 61 are disposed below the ground pad PGND.

FIG. 5 is a cross-sectional view showing another example of the structure of the ground pad PGND. In FIG. 5, electrically conductive layers 7, 8, and 9 are formed, for example, by plating on the pad metal 6. The electrically conductive layer 7 is made of a material that satisfactorily joins to the pad metal 6, which is made of aluminum or aluminum alloy, and examples of the material include nickel and nickel alloy. The electrically conductive layer 7 has a thickness ranging, for example, from 2 to 10 µm. The thick electrically conductive layer 7 is unlikely to transmit a large load applied when a bump or a bonding wire is joined to the ground pad PGND to the portion below the ground pad PGND. The load applied when a bump or a bonding wire is joined to the ground pad PGND therefore does not cause a situation in which the DC voltage generation circuit 61, which is provided below the ground pad PGND, malfunctions. The electrically conductive layer 8 is interposed between the electrically conductive layers 7 and 9 to improve the adhesion between the electrically conductive layers 7 and 9 and also function as a barrier layer that prevents the electrically conductive layer 7 from diffusing into the electrically conductive layer 9. The electrically conductive layer 8 is formed of a material that satisfactorily adheres to both the electrically conductive layers 7 and 9, and examples of the material include palladium or palladium alloy. The electrically conductive layer 8 only needs to be provided as required and can be omitted, for example, when the electrically conductive layers 7 and 9 satisfactorily adhere to each other. The electrically conductive layer 9 functions as a coupling layer coupled to a bump or a bonding wire. The electrically conductive layer 9 is made of a material having low contact resistance to a bump or a bonding wire, for example, gold or gold alloy. Using the ground pad PGND having the structure shown in FIG. 5 allows the DC voltage generation circuit 61 below the pad to be protected against the load applied in the mounting in which a bump or a bonding wire is joined to the ground pad PGND and further allows the bump or bonding wire to be joined with low contact resistance, whereby the mounting can be readily performed with improved reliability and other advantages are achieved.

In the present embodiment, which relates to the integrated circuit apparatus 20 including the oscillation circuit 30, the output buffer circuit 50, the DC voltage generation circuit 61, the power source pad PVDD, the ground pad PGND, and the clock pad PCK, the ground pad PGND and the DC voltage generation circuit 61 are disposed so as to overlap with each other in the plan view, as described above.

The ground pad PGND therefore functions as a shielding member, whereby the transmission of the high-frequency noise to the DC voltage generation circuit 61 can be suppressed. For example, the shielding effect provided by the ground pad PGND reduces the electromagnetic and electrostatic coupling of the output buffer circuit 50 and the clock pad PCK to the DC voltage generation circuit 61, preventing the high-frequency noise from being superimposed on the DC voltage outputted by the DC voltage generation circuit 61. The configuration described above can therefore prevent a decrease in the accuracy of the oscillation frequency and in turn a decrease in the accuracy of the clock frequency, a decrease in the accuracy of the clock frequency during the generation of the clock signal, and other problems due to the high-frequency noise. As a result, an integrated circuit apparatus 20 capable of generating a highly accurate clock signal CKQ can be achieved.

Furthermore, the arrangement in which the ground pad PGND and the DC voltage generation circuit 61 overlap with each other in the plan view allows effective use of the region of the ground pad PGND to dispose the DC voltage generation circuit 61. The situation in which the region of the ground pad PGND forms a dead space can therefore be avoided. As described above, the arrangement in which the DC voltage generation circuit 61 is disposed in the region of the ground pad PGND, which otherwise forms a dead space, allows reduction in the layout area of the integrated circuit apparatus 20 even when the ratio of the pad area to the total area of the integrated circuit apparatus 20 is large, whereby the size of the integrated circuit apparatus 20 can be reduced.

Furthermore, the arrangement in which the ground pad PGND and the DC voltage generation circuit 61 overlap with each other in the plan view allows the ground voltage from the ground pad PGND to be supplied to the DC voltage generation circuit 61 along the short ground wiring path from the ground pad PGND toward the DC voltage generation circuit 61 disposed immediately below the ground pad PGND. That is, the ground voltage from the ground pad PGND can be supplied to the DC voltage generation circuit 61 along a short path of second ground wiring separate from first ground wiring that couples the ground pad PGND to other circuits at distances far from the ground pad PGND. For example, the ground voltage from the ground pad PGND can be supplied along the path of the second ground wiring, which has very small impedance. The configuration described above can therefore prevent potential fluctuation caused by the impedance of the first ground wiring, which couples the ground pad PGND to other circuits at distances far from the ground pad PGND, from adversely affecting the DC voltage outputted by the DC voltage generation circuit 61. As a result, a decrease in the accuracy of the clock frequency due to the potential fluctuation can be avoided, whereby an integrated circuit apparatus 20 capable of generating a highly accurate clock signal CKQ can be achieved.

The DC voltage generation circuit 61, which is disposed below the ground pad PGND, is a circuit that generates the DC voltage used to generate the oscillation signal OSC or the clock signal CKQ. For example, the DC voltage generation circuit 61 is a circuit that generates the reference voltage, a frequency control voltage, and other DC voltages inputted to the oscillation circuit 30. Instead, the DC voltage generation circuit 61 is a circuit that generates the reference voltage, the frequency control voltage, and other DC voltages inputted to a frequency controlling voltage generation circuit, such as the temperature compensation circuit 80, which controls the oscillation frequency of the oscillation circuit 30. Still instead, the DC voltage generation circuit 61 is a DC voltage generation circuit used in the PLL circuit 40, which operates based on the oscillation signal OSC from the oscillation circuit 30.

Specifically, the DC voltage generation circuit is the reference voltage generation circuit 62, which generates the reference voltage for generating at least one of bias currents, bias voltages, and regulated power source voltages. That is, the ground pad PGND and the reference voltage generation circuit 62, which is the DC voltage generation circuit 61, are disposed so as to overlap with each other in the plan view. The shielding effect provided by the ground pad PGND therefore reduces the electromagnetic and electrostatic coupling of the output buffer circuit 50 and the clock pad PCK to the reference voltage generation circuit 62, preventing the high-frequency noise from being superimposed on the reference voltage outputted by the reference voltage generation circuit 62. A decrease in the accuracy of the clock frequency due to high-frequency noise can therefore be avoided. Furthermore, since the region of the ground pad PGND can be effectively used to dispose the reference voltage generation circuit 62, the layout area of the integrated circuit apparatus 20 can be reduced, whereby the size of the integrated circuit apparatus 20 can be reduced. Moreover, the ground voltage from the ground pad PGND can be supplied to the reference voltage generation circuit 62 along the short path of the second ground wiring separate from the first ground wiring that couples the ground pad PGND to other circuits at distances far from the ground pad PGND. The transmission of the potential fluctuation caused by the impedance of the first ground wiring, which couples other circuits to the ground pad PGND, to the reference voltage from the reference voltage generation circuit 62, can therefore be suppressed, whereby a decrease in the accuracy of the clock frequency due to the potential fluctuation can be avoided.

The DC voltage generation circuit 61 may instead be the regulator 64, which generates the regulated power source voltage based on the power source voltage VDD. That is, the ground pad PGND and the regulator 64, which is the DC voltage generation circuit 61, are disposed so as to overlap with each other in the plan view. The shielding effect provided by the ground pad PGND can thus prevent the high-frequency noise from being superimposed on the regulated power source voltage outputted by the regulator 64, preventing the accuracy of the clock frequency from decreasing due to the high-frequency noise. Furthermore, the region of the ground pad PGND can be effectively used to dispose the regulator 64, whereby the size of the integrated circuit apparatus 20 can be reduced. The transmission of the potential fluctuation caused by the impedance of the ground wiring that couples other circuits to the ground pad PGND to the regulated power source voltage from the regulator 64 can be suppressed, whereby a decrease in the accuracy of the clock frequency due to the potential fluctuation can be avoided.

The integrated circuit apparatus 20 includes the PLL circuit 40, which generates the clock signal CK based on the oscillation signal OSC, and the PLL circuit 40 includes the phase comparator 41, the charge pump circuit 42, and the loop filter 43, as shown in FIG. 3. In this case, the DC voltage generation circuit 61, which is disposed so as to overlap with the ground pad PGND in the plan view, may be the charge pump circuit 42, the loop filter 43, or the regulator 66, which supplies the charge pump circuit 42 with the regulated power source voltage VREG2. That is, the ground pad PGND and the charge pump circuit 42, the loop filter 43, or the regulator 66, which are the DC voltage generation circuit 61, are disposed so as to overlap with each other in the plan view. The shielding effect provided by the ground pad PGND can thus prevent the high-frequency noise from being superimposed on the voltage outputted by the charge pump circuit 42, the loop filter 43, or the regulator 66, preventing the accuracy of the clock frequency from decreasing due to the high-frequency noise. Furthermore, the region of the ground pad PGND can be effectively used to dispose the charge pump circuit 42, the loop filter 43, or the regulator 66, whereby the size of the integrated circuit apparatus 20 can be reduced. The transmission of the potential fluctuation caused by the impedance of the ground wiring that couples other circuits to the ground pad PGND to the voltage outputted from the charge pump circuit 42, the loop filter 43, or the regulator 66 can be suppressed, whereby a decrease in the accuracy of the clock frequency due to the potential fluctuation can be avoided.

Figure 6:
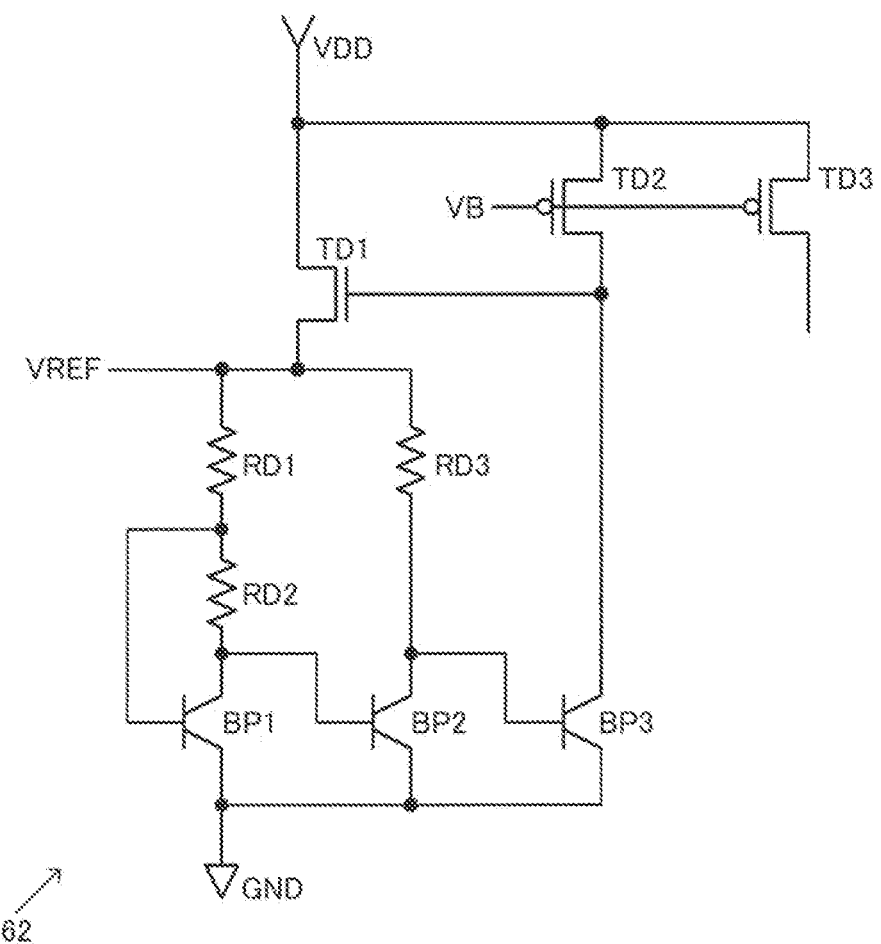
FIG. 6 shows an example of the configuration of a reference voltage generation circuit.

FIG. 6 shows an example of the configuration of the reference voltage generation circuit 62. The reference voltage generation circuit 62 in FIG. 6 includes an N-type transistor TD1, resistors RD1, RD2, and RD3, and bipolar transistors BP1 and BP2, which are provided between a VDD node and a GND node. The reference voltage generation circuit 62 further includes P-type transistors TD2 and TD3, each having a gate to which a bias voltage VB is inputted, and a bipolar transistor BP3, which is provided between the drain node of the transistor TD2 and the GND node. The reference voltage generation circuit 62 is a bandgap reference circuit, generates a reference voltage VREF based on a bandgap voltage, and outputs the reference voltage VREF. For example, let VBE1 and VBE2 be the base-emitter voltages of PNP-type bipolar transistors BP1 and BP2 and ΔVBE be VBE1−VBE2. The reference voltage generation circuit 62 outputs the reference voltage VREF that satisfies, for example, VREF=K×ΔVBE+VBE2. The value K is set by the resistance values of the resistors RD1 and RD2. For example, VBE2 has a negative temperature characteristic, and ΔVBE has a positive temperature characteristic, so that a constant reference voltage VREF having no temperature dependence can be generated by adjusting the resistance values of the resistors RD1 and RD2. The generated reference voltage VREF is a constant voltage with respect to the ground voltage.

Figure 7:
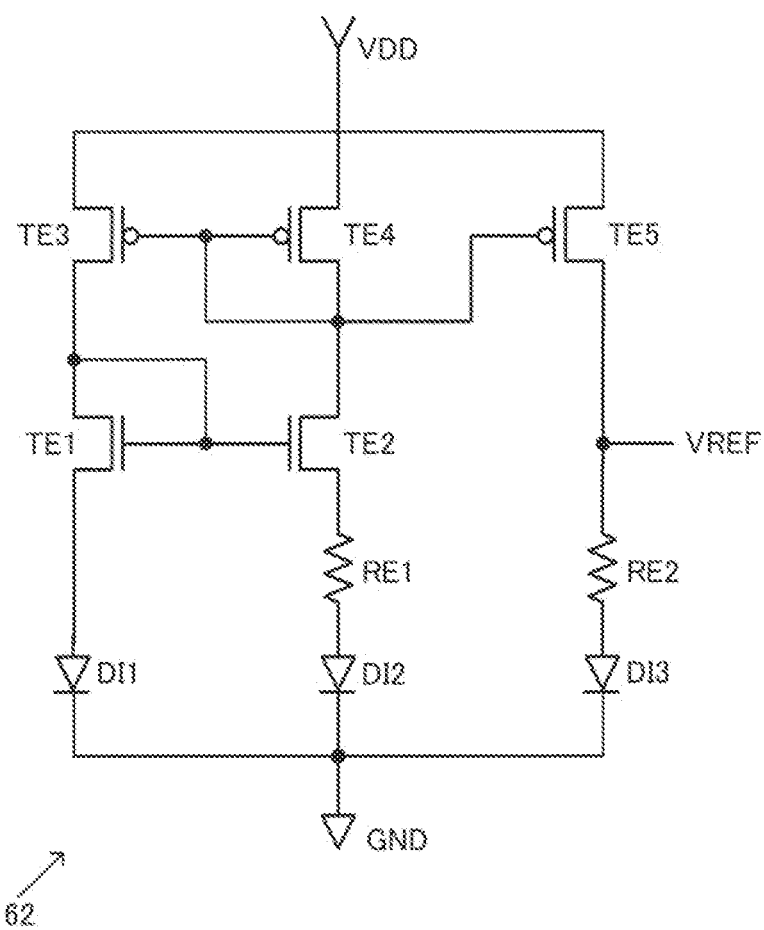
FIG. 7 shows another example of the configuration of the reference voltage generation circuit.

FIG. 7 shows another example of the configuration of the reference voltage generation circuit 62. The reference voltage generation circuit 62 in FIG. 7 is also a bandgap reference circuit and includes N-type transistors TE1 and TE2, P-type transistors TE3, TE4, and TE5, resistors RE1 and RE2, and diodes DI1, DI2, and DI3 each having PN junctions. The N-type transistors TE1 and TE2 form a current mirror circuit, and the P-type transistors TE3, TE4, and TE5 also form a current mirror circuit, so that substantially the same current flows through these transistors. The voltages at the sources of the N-type transistors TE1 and TE2 are also substantially the same. The diodes DI1 and DI2 are so formed that the number of parallelly coupled PN junctions in the diode DI2 is M times the number of parallelly coupled PN junctions in the diode DI1. Therefore, let Is be the saturation current flowing through the diode DI1, and the saturation current flowing through the diode DI2 is M×Is. Let I be the current flowing through the transistors TE3, TE4, and TE5, Vd1, Vd2, and Vd3 be the voltages across the diodes DI1, DI2, and DI3, and R1 and R2 be the resistance values of the resistors RE1 and RE2, and the reference voltage VREF generated by the reference voltage generation circuit 62 is expressed by Expression (1) below.

$$VREF = I \cdot R2 + Vd3 = (R2/R1) \cdot (kT/q) \cdot \ln(M) + Vd3 \quad (1)$$

where k is Boltzmann's constant, T is the absolute temperature, and q is the charge of an electron Differentiating Expression (1) above with respect to the absolute temperature T provides Expression (2) below.

$$dVREF/dT = (R2/R1) \cdot (k/q) \cdot \ln(M) + Vd3/dT \quad (2)$$

In Expression (2) described above, the term Vd3/dT has a negative temperature characteristic, and adjusting the value of $(R2/R1) \cdot (k/q) \cdot \ln(M)$ to a positive value in correspondence with the negative temperature characteristic allows the value of Expression (2) described above to be zero, whereby a reference voltage VREF with the temperature dependence thereof cancelled can be generated. The reference voltage generation circuit 62 does not necessarily have the configuration shown in FIG. 6 or 7 and can be a circuit having any of a variety of other configurations, for example, a circuit that uses a transistor work function difference voltage to generate the reference voltage VREF.

Figure 8:
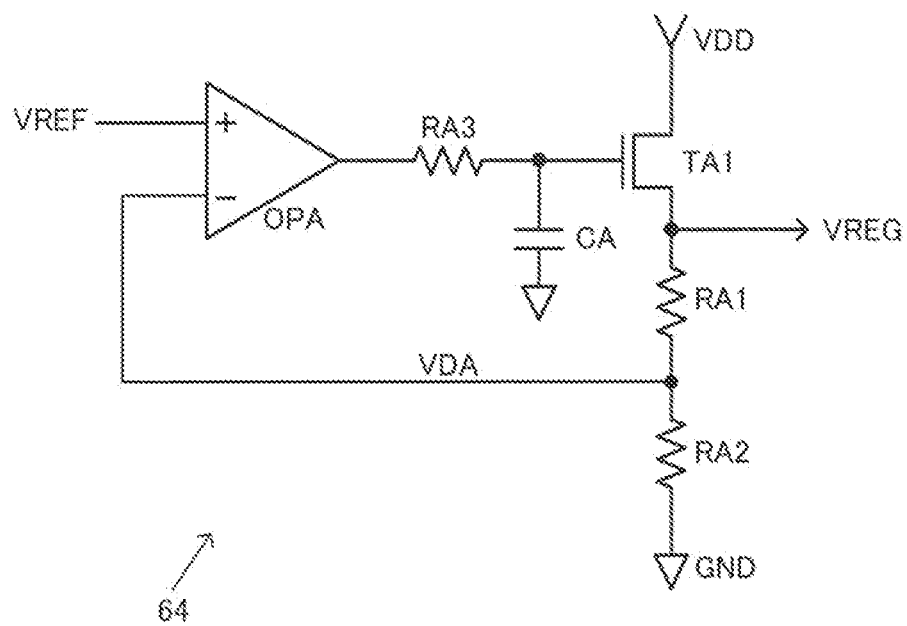
FIG. 8 shows an example of the configuration of a regulator.
Figure 9:
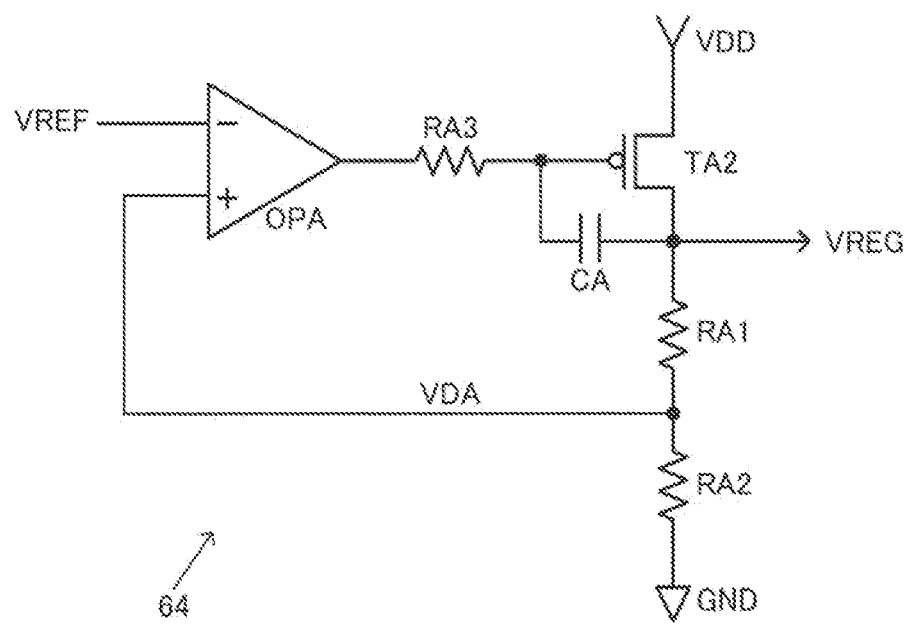
FIG. 9 shows another example of the configuration of the regulator.

FIG. 8 shows an example of the configuration of the regulator 64. The regulator 64 includes an N-type transistor TA1 and resistors RA1 and RA2 for driving purposes provided in series between the VDD node and the GND node and further includes an arithmetic amplifier OPA. The regulator 64 can further include a resistor RA3 and a capacitor CA provided on the side facing the output terminal of the operational amplifier OPA. The reference voltage VREF is inputted to the non-inverted input terminal of the operational amplifier OPA, and a voltage VDA, which is the result of the division of the regulated power source voltage VREG by the resistors RA1 and RA2, is inputted to the inverted input terminal of the operational amplifier OPA. A signal from the output terminal of the operation amplifier OPA is inputted to the gate of the transistor TA1 via the resistor RA3, and the regulated power source voltage VREG is outputted via the drain node of the transistor TA1. FIG. shows another example of the configuration of the regulator 64. In FIG. 9, unlike in FIG. 8, the driving transistor is a P-type transistor TA2, the reference voltage VREF is inputted to the inverted input terminal of the operation amplifier OPA, and the voltage VDA is inputted to the non-inverted input terminal of the operation amplifier OPA. Furthermore, the capacitor CA for phase compensation in FIG. 9 also differs from that in FIG. 8 in terms of coupling configuration. The regulators 65, 66, 67, and 68 described with reference to FIG. 3 can be achieved, for example, by the regulator 64 having the configuration shown in FIG. 8 or 9.

As described above, the reference voltage generation circuit 62 and the regulator 64 generate the reference voltage VREF and the regulated power source voltage VREG, respectively, with respect to the ground voltage. Therefore, when the high-frequency noise from the output buffer circuit 50 and other sources is superimposed on the ground voltage, the potentials of the reference voltage VREF and the regulated power source voltage VREG also undesirably fluctuate. It is therefore important to take measures to suppress the superimposition of the high-frequency noise from the output buffer circuit 50 and other sources on the ground voltage.

Figure 10:
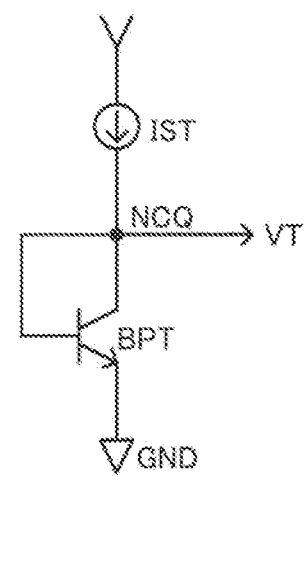
FIG. 10 shows an example of the configuration of a temperature sensor circuit.

FIG. 10 shows an example of the configuration of the temperature sensor circuit 90. The temperature sensor circuit 90 includes a current source IST and a bipolar transistor BPT provided in series between the power source node and the GND node. The collector node and the base node of the bipolar transistor BPT are coupled to each other, resulting in diode coupling. The temperature detection voltage VT having temperature dependence is therefore outputted via an output node NCQ of the temperature sensor circuit 90. For example, a temperature detection voltage VT generated by the temperature dependence of the base-emitter voltage and having a negative temperature characteristic is outputted. The configuration of the temperature sensor circuit 90 is not limited to the configuration shown in FIG. 10 and can be changed in a variety of manners. For example, a resistor may be placed between the output node NCQ of the temperature sensor circuit 90 and the collector node of the bipolar transistor BPT, and a variable resistor may be provided between the emitter node of the bipolar transistor BPT and the GND node. The configuration described above allows the temperature sensor circuit 90 to perform zeroth-order correction of the temperature compensation.

Figure 11:
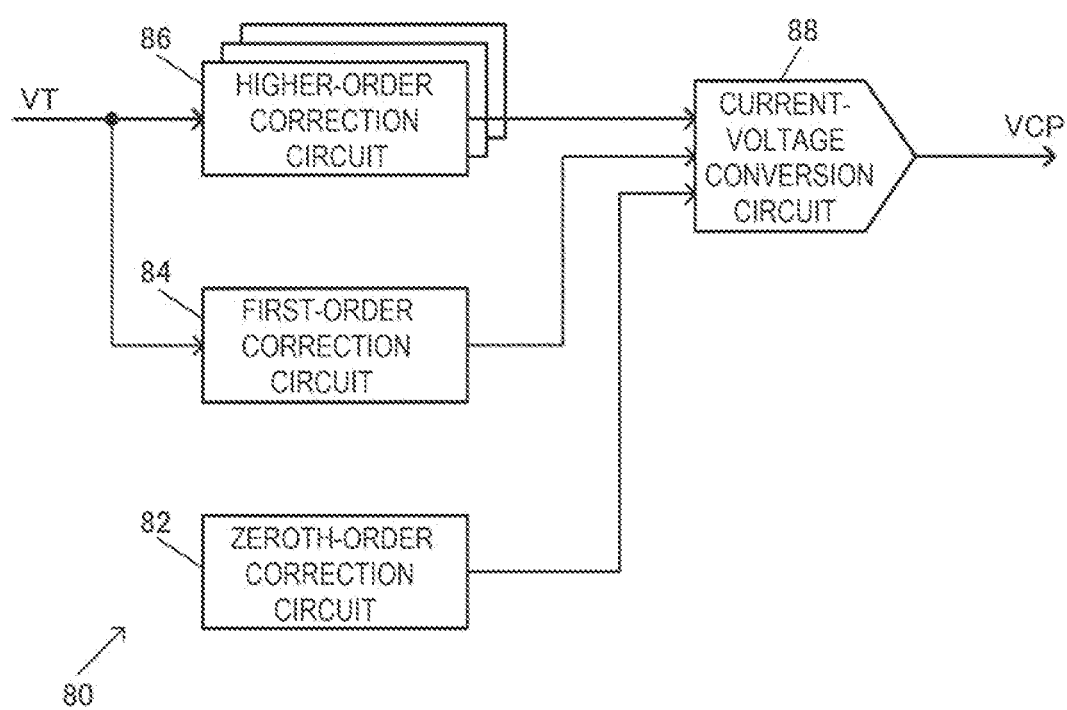
FIG. 11 shows an example of the configuration of a temperature compensation circuit.

FIG. 11 shows an example of the configuration of the temperature compensation circuit 80. The temperature compensation circuit 80 includes a zeroth-order correction circuit 82, a first-order correction circuit 84, a higher-order correction circuit 86, and a current-to-voltage conversion circuit 88. To perform, for example, third-order correction, fourth-order correction, fifth-order correction, and so on, a plurality of correction circuits, such as a third-order correction circuit, a fourth-order correction circuit, a fifth-order correction circuit, and so on are provided as the higher-order correction circuit 86. The higher-order correction circuit 86 is also called a function generator circuit and generates a function current corresponding to a polynomial that allows approximation of the characteristics of the temperature compensating voltage VCP. The polynomial is, for example, a function having a variable that is the temperature.

The temperature compensation circuit 80 performs analog temperature compensation using polynomial approximation. Specifically, the temperature compensation circuit 80 generates the temperature compensation voltage VCP based on approximation of the polynomial, which is a function having a variable that is the temperature, and outputs the generated temperature compensation voltage VCP. For example, the nonvolatile memory 78 in FIG. 2 stores zeroth-order, first-order, and higher-order coefficients of the polynomial, which allows approximation of the characteristics of the temperature compensation voltage VCP, as zeroth-order correction data, first-order correction data, and higher-order correction data. The zeroth-order correction circuit 82, the first-order correction circuit 84, and the higher-order correction circuit 86 then output a zeroth-order correction current signal, a first-order correction current signal, and a higher-order correction current signal based on the zeroth-order correction data, the first-order correction data, and the higher-order correction data. The zeroth-order correction current signal, the first-order correction current signal, and the higher-order correction current signal can be referred to as a zeroth-order component signal, a first-order component signal, and a higher-order component signal of the function current. The first-order correction circuit 84 and the higher-order correction circuit 86 generate the first-order corrected current signal and the higher-order corrected current signal based on the temperature detection voltage VT, which linearly changes with respect to the temperature, and output the generated correction current signals. The current-to-voltage conversion circuit 88 performs addition and current-to-voltage conversion on the zeroth-order correction current signal, the first-order correction current signal, and the higher-order correction current signal and outputs the temperature compensation voltage VCP. The analog temperature compensation using polynomial approximation is thus achieved. When the temperature sensor circuit 90 is used to perform the zeroth-order correction of the temperature compensation as described above, the configuration of the zeroth-order correction circuit 82 can be omitted.

2. Layout

Figure 12:
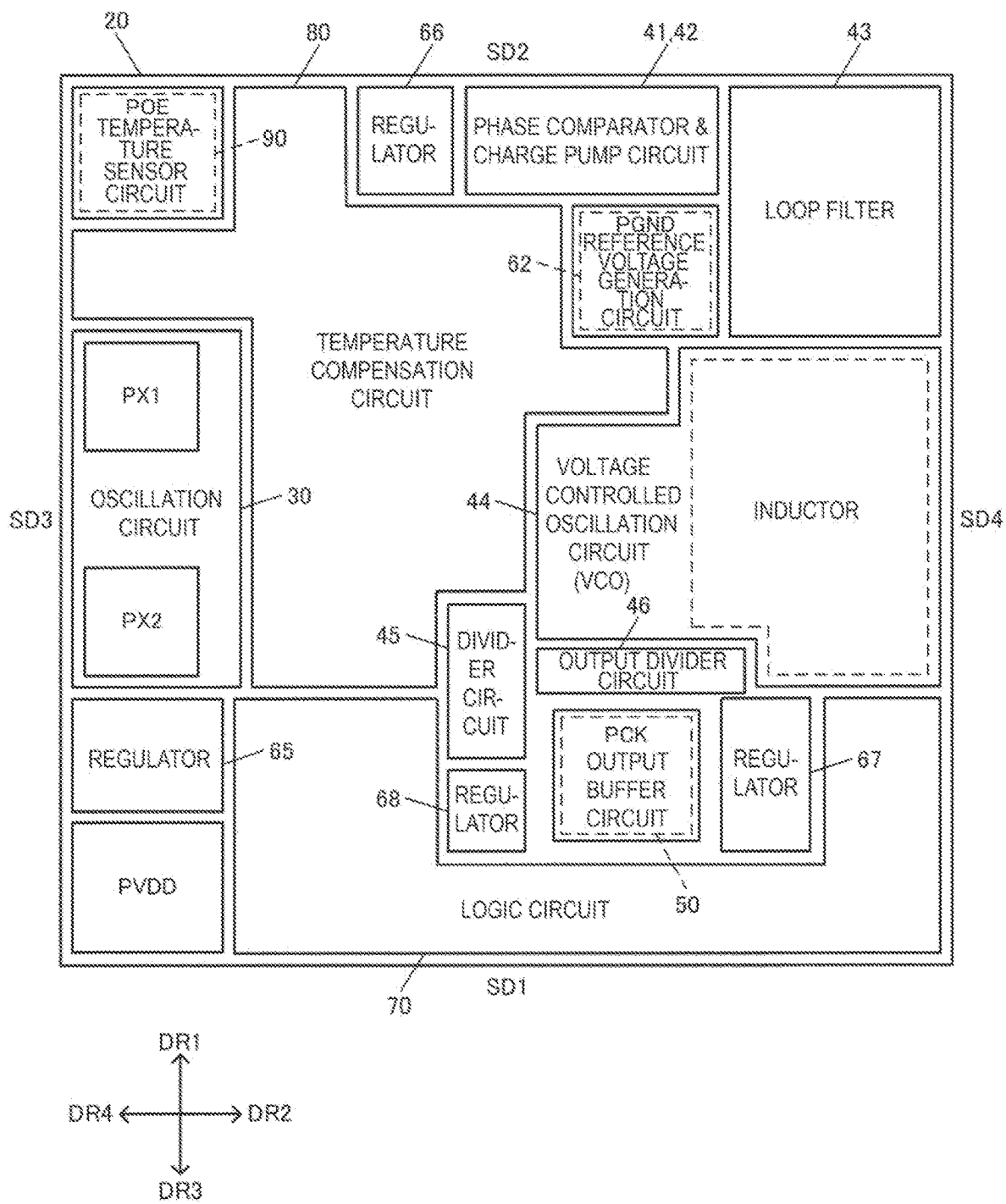
FIG. 12 shows an example of the layout of the integrated circuit apparatus according to the embodiment.

FIG. 12 shows an example of the layout of the integrated circuit apparatus 20 according to the present embodiment. The external shape of the integrated circuit apparatus 20 has an edge SD1 and an edge SD2 facing the edge SD1. The edge SD1 is a first edge, the edge SD2 is a second edge, and the edge SD2 is the edge facing the edge SD1. The external shape of the integrated circuit apparatus 20 further has edges SD3 and SD4, which intersect with the edges SD1 and SD2. The edge SD3 is a third edge, the edge SD4 is a fourth edge, and the edge SD4 is the edge facing the edge SD3. The external shape of the integrated circuit apparatus 20 is, for example, the external shape of a rectangular semiconductor chip that is the integrated circuit apparatus 20. For example, the edges SD1, SD2, SD3, and SD4 are the edges of the substrate of the semiconductor chip. The semiconductor chip is also called a silicon die. In the description, DR1 represents the direction from the edge SD1 toward the edge SD2, and DR2 represents the direction from the edge SD3 toward the edge SD4. Similarly, DR3 represents the direction opposite the direction DR1, and DR4 represents the direction opposite the direction DR2. The directions DR1, DR2, DR3, and DR4 are first, second, third, and fourth directions, respectively.

The integrated circuit apparatus 20 is provided with the ground pad PGND, the power source pad PVDD, the clock pad PCK, the output enable pad POE, and the pads PX1 and PX2 for resonator coupling, as shown in FIG. 12. For example, the power source pad PVDD is disposed at a first corner where the edges SD1 and SD3 intersect with each other. The output enable pad POE is placed at a second corner where the edges SD2 and SD3 intersect with each other. The clock pad PCK is disposed on the side facing the edge SD1, and the ground pad PGND is disposed on the side facing the edge SD2. For example, the clock pad PCK is disposed in a first region that extends from the center line between the edges SD1 and SD2 to the edge SD1, and the ground pad PGND is disposed in a second region that extends from the center line between the edges SD1 and SD2 to the edge SD2. The pads PX1 and PX2 for resonator coupling are disposed between the power source pad PVDD and the output enable pad POE along the edge SD3. For example, the oscillation circuit 30 and pads PX1 and PX2 are disposed in a region along the edge SD3.

In FIG. 12, the reference voltage generation circuit 62, which serves as the DC voltage generation circuit 61, is disposed so as to overlap with the ground pad PGND in the plan view. That is, the reference voltage generation circuit 62 is disposed below the ground pad PGND, as described with reference to FIGS. 4 and 5. The shielding effect provided by the ground pad PGND thus suppresses transmission of the high-frequency noise to the reference voltage generation circuit 62, preventing potential fluctuation that lowers the accuracy of the clock frequency from occurring in the reference voltage generated by the reference voltage generation circuit 62. Furthermore, the region where the ground pad PGND is disposed can be effectively used to dispose the reference voltage generation circuit 62, whereby the area of the integrated circuit apparatus 20 can be reduced.

Furthermore, in the integrated circuit apparatus 20 according to the present embodiment, the clock pad PCK and the output buffer circuit 50 are disposed so as to overlap with each other in the plan view, as shown in FIG. 12. That is, the output buffer circuit 50 is disposed below the clock pad PCK, as in the arrangement of the ground pad PGND and the DC voltage generation circuit 61 in FIGS. 4 and 5. It is noted that all the circuit portions of the output buffer circuit 50 do not necessarily fall within the clock pad PCK in the plan view. For example, a layout in which part of the output buffer circuit 50 does not fall within the clock pad PCK may be employed.

Arranging the clock pad PCK and the output buffer circuit 50 so as to overlap with each other in the plan view allows the clock signal CKQ from the output buffer circuit 50 to be outputted to the clock pad PCK located immediately thereabove in a short, clock wiring path from the output buffer circuit 50 toward the clock pad PCK. The impedance of the clock wiring can therefore be minimized, so that the potential fluctuation caused by the impedance can be suppressed. The output buffer circuit 50, which needs to drive a large external load, has a high driving capability. Therefore, a high-impedance clock wiring has large potential fluctuation, so that the signal quality of the clock signal CKQ deteriorates. In this regard, arranging the clock pad PCK and the output buffer circuit 50 so as to overlap with each other in the plan view allows a short path of the clock wiring that couples the output buffer circuit 50 and the clock pad PCK to each other, whereby the impedance of the clock wiring can be minimized, so that the deterioration of the signal quality of the clock signal CKQ can be suppressed. Since the output buffer circuit 50 has a high driving capability to drive an external load and therefore produces a large amount of high-frequency noise, the output buffer circuit 50 and the clock pad PCK, via which the clock signal CKQ is outputted, form high-frequency noise sources. In this regard, arranging the clock pad PCK and the output buffer circuit 50 so as to overlap with each other in the plan view allows the high-frequency noise sources to be disposed collectively at one place. The layout that reduces the adverse effects of the noise from the high-frequency noise sources and other measures can thus be readily implemented.

The outer shape of the integrated circuit apparatus 20 has the edge SD1 and the edge SD2 facing the edge SD1, the output buffer circuit 50 and the clock pad PCK are disposed on the side facing the edge SD1, and the reference voltage generation circuit 62, which is the DC voltage generation circuit 61, and the ground pad PGND are disposed on the side facing the edge SD2, as shown in FIG. 12. The edge SD1 is the first edge, and the edge SD2 is the second edge. For example, the output buffer circuit 50 and the clock pad PCK are disposed at a location closer to the edge SD1 than to the edge SD2. The reference voltage generation circuit 62, which is the DC voltage generation circuit 61, and the ground pad PGND are disposed at a location closer to the edge SD2 than to the edge SD1. For example, the output buffer circuit 50 and the clock pad PCK are disposed in the first region, which extends from the center line between the edges SD1 and SD2 to the edge SD1, and the reference voltage generation circuit 62 and the ground pad PGND are disposed in the second region, which extends from the center line between edges SD1 and SD2 to the edge SD2. Therefore, the output buffer circuit 50 and the clock pad PCK, which are high-frequency noise sources, are disposed on the side facing the edge SD1, while the reference voltage generation circuit 62 and the ground pad PGND, which need to avoid high-frequency noise, are disposed on the side facing the edge SD2. The distance from the output buffer circuit 50 and the clock pad PCK, which are high-frequency noise sources, to the reference voltage generation circuit 62 and the ground pad PGND can thus be increased. The transmission of the high-frequency noise from the output buffer circuit 50 and the clock pad PCK to the reference voltage generation circuit 62 and the ground pad PGND can therefore be suppressed, whereby deterioration of the accuracy of the clock frequency caused by high-frequency noise can be avoided.

The integrated circuit apparatus 20 includes the PLL circuit 40, which performs the PLL operation of generating the clock signal CKQ phase-locked to the oscillation signal OSC. For example, the PLL circuit 40 outputs the clock signal CK phase-locked to the oscillation signal OSC, and the output buffer circuit 50 buffers the clock signal CK and outputs the buffered clock signal CK as the clock signal CKQ. The clock signal CKQ phase-locked to the oscillation signal OSC is thus outputted from the integrated circuit apparatus 20. The DC voltage generation circuit 61 is the reference voltage generation circuit 62, which generates the reference voltage used in the operation of the PLL circuit 40. Referring to FIG. 3 as an example, the regulators 66 and 67 generate the regulated power source voltages VREG2 and VREG3 based on the reference voltage VREF generated by the reference voltage generation circuit 62, and PLL circuit 40 operates based on the regulated power source voltages VREG2 and VREG3. Instead, the charge pump circuit 42, the voltage controlled oscillation circuit 44, and other components of the PLL circuit 40 perform the charge pumping operation. the oscillation operation based on a bias current or a bias voltage based on the reference voltage VREF generated by the reference voltage generation circuit 62. Providing the thus configured PLL circuit 40 allows the integrated circuit apparatus 20 to output the clock signal CKQ phase-locked to the oscillation signal OSC and having a frequency set at a desired frequency. The thus configured reference voltage generation circuit 62, which generates the reference voltage necessary for the operation of the PLL circuit 40, is disposed so as to overlap with the ground pad PGND in the plan view. Therefore, a decrease in the accuracy of the clock frequency caused by the high-frequency noise can be avoided, the region of the ground pad PGND can be effectively used to dispose the reference voltage generation circuit 62 in such a way that the size of the integrated circuit apparatus 20 is reduced, and other advantages are achieved.

The PLL circuit 40 includes the phase comparator 41, the charge pump circuit 42, and the loop filter 43, as described with reference to FIG. 3. The charge pump circuit 42 is provided on the side facing the edge SD2, which is the second edge, as shown in FIG. 12. For example, the charge pump circuit 42 is provided between the edge SD2 and the ground pad PGND in FIG. 12. For example, let DR1 be the direction from the edge SD1 toward the edge SD2, and the charge pump circuit 42 is disposed in a position shifted from the ground pad PGND in the direction DR1. Specifically, the charge pump circuit 42 is disposed along the edge SD2 along with the phase comparator 41. That is, the charge pump circuit 42 is so disposed that the longitudinal direction thereof extends along the edge SD2. The charge pump circuit 42 can thus be disposed along with the reference voltage generation circuit 62 and the ground pad PGND collectively on the side facing the edge SD2. The charge pump circuit 42, the reference voltage generation circuit 62, and the ground pad PGND can therefore be disposed collectively at a distance far away from the output buffer circuit 50 and the clock pad PCK, which are disposed on the side facing the edge SD1. The transmission of the high-frequency noise from the output buffer circuit 50 and the clock pad PCK to the charge pump circuit 42, the reference voltage generation circuit 62, the ground pad PGND can therefore be suppressed, whereby deterioration of the accuracy of the clock frequency caused by high-frequency noise can be avoided. That is, capacitive coupling due to parasitic capacitance CP is present between the output of the output buffer circuit 50 and the output of the charge pump circuit 42, as shown in FIG. 3, and the capacitive coupling may cause the high-frequency noise from the output buffer circuit 50 to be superimposed on the output signal from the charge pump circuit 42. When the high-frequency noise is superimposed on the output signal from the charge pump circuit 42, the potential of the control voltage inputted to the voltage controlled oscillation circuit 44 undesirably fluctuates, so that the accuracy of the clock frequency of the clock signal CK outputted by the PLL circuit 40 decreases, and the accuracy of the clock signal CKQ outputted by the integrated circuit apparatus 20 also undesirably decreases. In this regard, arranging the charge pump circuit 42 on the side facing the edge SD2 allows an increase in the distance from the output buffer circuit 50 and the clock pad PCK, which are placed on the side facing the edge SD1, so that the transmission of the noise from the high-frequency noise sources can be suppressed, whereby a decrease in the accuracy of the clock frequency can be avoided.

The loop filter 43 is provided on the side facing the edge SD2, as shown in FIG. 12. For example, the loop filter 43 is disposed at a third corner where the edges SD2 and SD4 intersect with each other in FIG. 12. For example, let DR2 be the direction from the edge SD3 toward the edge SD4, and the loop filter 43 is provided in a position shifted from the ground pad PGND and the charge pump circuit 42 in the direction DR2. The loop filter 43 can thus be disposed along with the charge pump circuit 42, the reference voltage generation circuit 62, and ground pad PGND collectively on the side facing the edge SD2. The loop filter 43, the charge pump circuit 42, the reference voltage generation circuit 62, and the ground pad PGND can therefore be collectively disposed at a distance far from the output buffer circuit 50 and the clock pad PCK, which are disposed on the side facing the edge SD1. The transmission of the high-frequency noise from the output buffer circuit 50 and the clock pad PCK to the loop filter 43, the charge pump circuit 42, the reference voltage generation circuit 62, and the ground pad PGND can thus be suppressed, whereby deterioration of the accuracy of the clock frequency caused by high-frequency noise can be avoided.

The integrated circuit apparatus 20 includes the regulator 66, which supplies the charge pump circuit 42 with the regulated power source voltage VREG2 generated based on the reference voltage VREF, as described in FIG. 3. The regulator 66 is provided on the side facing the edge SD2. When the high-frequency noise is superimposed on the output signal from the charge pump circuit 42, the potential of the control voltage inputted to the voltage controlled oscillation circuit 44 undesirably fluctuates, so that the accuracy of the clock frequency of the clock signal CK outputted by the PLL circuit 40 decreases. Therefore, in the present embodiment, the regulator 66 for the charge pump circuit 42 is provided, and the charge pump circuit 42 is operated by the regulated power source voltage VREG2 generated by the regulator 66. However, when the high-frequency noise from the output buffer circuit 50 and other components is superimposed on the regulated power source voltage VREG2, the high-frequency noise is also superimposed on the output signal from the charge pump circuit 42, so that the accuracy of the clock frequency of the clock signal CK outputted by the PLL circuit 40 decreases, and the accuracy of the clock frequency of the clock signal CKQ outputted by the integrated circuit apparatus 20 also undesirably decreases. In this regard, not only the charge pump circuit 42 but the regulator 66, which supplies the charge pump circuit 42 with the regulated power source voltage VREG2, are disposed collectively on the side facing the edge SD2 in FIG. 12. The distance between the regulator 66 and the high-frequency noise sources, such as the output buffer circuit 50, can also thus be increased. The superimposition of the high-frequency noise on the regulated power source voltage VREG2 can thus be suppressed, whereby the deterioration of the accuracy of the clock frequency can be avoided. Furthermore, since the regulated power source voltage VREG2 from the regulator 66 can be supplied to the charge pump circuit 42 along a short power source supply line, the fluctuation in the regulated power source voltage VREG2 caused by the impedance of the power source supply line can also be suppressed.

In FIG. 12, the regulator 65, which supplies the oscillation circuit 30 and other components with the regulated power source voltage VREG1, is disposed on the side facing the edge SD3. For example, the regulator 65 is disposed along the edge SD3 between the edge SD1 and the oscillation circuit 30 and is located in the vicinity of the oscillation circuit 30. The regulated power source voltage VREG1 from the regulator 65 can thus be supplied to the oscillation circuit 30 and other components via a short power source supply line, whereby the fluctuation in the regulated power source voltage VREG1 caused by the impedance of the power source supply line can be suppressed. The regulator 67, which supplies the voltage controlled oscillation circuit 44 and other components with the regulated power source voltage VREG3, is disposed on the side facing the edge SD1. For example, the regulator 67 is disposed between the edge SD1 and the voltage controlled oscillation circuit 44. The regulator 68, which supplies the logic circuit 70 and other components with the regulated power source voltage VREG4, is also disposed on the side facing the edge SD1. For example, the regulator 68 is disposed between the logic circuit 70 and the temperature compensation circuit 80 and located in the vicinity of the logic circuit 70. The regulated power source voltages VREG3 and VREG4 from the regulators 67 and 68 can be supplied to the voltage controlled oscillation circuit 44, the logic circuit 70, and other components via a short power source supply line, whereby the fluctuation in the regulated power source voltages VREG3 and VREG4 caused by the impedance of the power source supply line can be suppressed.

The integrated circuit apparatus 20 further includes the logic circuit 70, which controls the PLL circuit 40. Referring to FIG. 3 as an example, the logic circuit 70 controls the setting of the division ratio of the divider circuit 45 of the PLL circuit 40 based on delta-sigma modulation. Instead, the logic circuit 70 may enable and disable the operation of the PLL circuit 40 or set a variety of operation modes of the PLL circuit 40. In FIG. 12, the logic circuit 70, which controls the PLL circuit 40 as described above, is provided on the side facing the edge SD1. For example, the logic circuit 70 operates based on a clock signal for logic operations and generates high-frequency noise due to the logic operations. When the high-frequency noise is superimposed on the reference voltage generated by the reference voltage generation circuit 62 and the output signal from the charge pump circuit 42, the problem of a decrease in the accuracy of the clock frequency occurs. In this regard, in FIG. 12, the logic circuit 70 is also disposed along with the output buffer circuit 50 and other components on the side facing the edge SD1. The distance from the reference voltage generation circuit 62, the charge pump circuit 42, and other components disposed on the side facing the edge SD2 to the logic circuit 70, the output buffer circuit 50, and other components that are high-frequency noise sources, can thus be increased, whereby a decrease in the accuracy of the clock frequency caused by the high-frequency noise can be avoided.

The PLL circuit 40 includes the voltage controlled oscillation circuit 44, as shown in FIG. 3. For example, the PLL circuit 40 includes the voltage controlled oscillation circuit 44, which oscillates at an oscillation frequency according to the control voltage from the loop filter 43 and outputs the clock signal CKV. The voltage controlled oscillation circuit 44 is provided between the clock pad PCK and the ground pad PGND, as shown in FIG. 12. For example, the voltage controlled oscillation circuit 44 is provided in a position shifted from the clock pad PCK in the direction DR1, and the ground pad PGND is provided in a position shifted from the voltage controlled oscillation circuit 44 in the direction DR1. The region between the clock pad PCK and the ground pad PGND can thus be effectively used to dispose the voltage controlled oscillation circuit 44, whereby the voltage control oscillation circuit 44 can be efficiently laid out. The clock signal CKV generated by the voltage controlled oscillation circuit 44 can be inputted as the clock signal CK to the output buffer circuit 50 along a short clock signal wiring, for example, via the output divider circuit 46. The output buffer circuit 50 can then buffer the clock signal CK and output the buffered clock signal CK as the clock signal CKQ. For example, shortening the clock signal wiring allows reduction in the high-frequency noise generated by the clock signal wiring. The voltage controlled oscillation circuit 44 includes a resonant circuit using an inductor, and most of the region where the voltage controlled oscillation circuit 44 is disposed is the region where the inductor is disposed. The inductor is achieved, for example, by wiring a metal wire in a spiral pattern.

The outer shape of the integrated circuit apparatus 20 has the edge SD3, which is the third edge and intersects with the edges SD1 and SD2, and the oscillation circuit 30 is provided on the side facing the edge SD3. The oscillation circuit 30 is provided, for example, along the edge SD3. Specifically, the oscillation circuit 30 is so disposed that, for example, the longitudinal direction thereof extends along the edge SD3. Arranging the oscillation circuit 30 on the side facing the edge SD3 as described above allows the distance from the output buffer circuit 50 and other components disposed on the side facing the edge SD1 to the oscillation circuit 30 can be increased, whereby the situation in which the high-frequency noise from the output buffer circuit 50 is superimposed on the oscillation signal OSC so that the oscillation characteristics deteriorate can be avoided. Furthermore, arranging the oscillation circuit 30 on the side facing the edge SD3 allows the distance from the reference voltage generation circuit 62 and other components disposed on the side facing the edge SD2 to the oscillation circuit 30 to be increased, whereby the situation in which oscillation noise from the oscillation circuit 30 is superimposed on the reference voltage from the reference voltage generation circuit 62 and other voltages so that the accuracy of the clock frequency decreases can be avoided.

The integrated circuit apparatus 20 further includes the temperature compensation circuit 80, which performs temperature compensation on the oscillation frequency of the oscillation signal OSC. The temperature compensation circuit 80 is provided between the oscillation circuit 30 and the set of the clock pad PCK and the ground pad PGND, as shown in FIG. 12. For example, the temperature compensation circuit 80 is provided in a position shifted from the oscillation circuit 30 in the direction DR2, and the clock pad PCK and the ground pad PGND are provided in a position shifted from the temperature compensation circuit in the direction DR2. Furthermore, the temperature compensation circuit 80 is provided between the oscillation circuit 30 and the voltage controlled oscillation circuit 44 in such a way that the temperature compensation circuit 80 is provided in a position shifted from the oscillation circuit 30 in the direction DR2, and the voltage controlled oscillation circuit 44 is provided in a position shifted from the temperature compensation circuit 80 in the direction DR2. Providing the temperature compensation circuit 80 between the oscillation circuit 30 and the set of the clock pad PCK and the ground pad PGND as described above allows the region between the oscillation circuit 30 and the set of the clock pad PCK and the ground pad PGND to be effectively used to dispose the temperature compensation circuit 80, whereby the temperature compensation circuit 80 can be efficiently laid out. Furthermore, the temperature compensation circuit 80 can be disposed in the vicinity of the oscillation circuit 30, whereby the temperature compensation voltage VCP from the temperature compensation circuit 80 can be inputted to the oscillation circuit 30 along a short signal path to achieve temperature compensation of the oscillation frequency.

The integrated circuit apparatus 20 further includes the temperature sensor circuit 90, which detects the temperature, the temperature compensation circuit 80, which performs temperature compensation on the oscillation frequency of the oscillation signal OSC based on the output from the temperature sensor circuit 90, and the output enable pad POE for controlling whether the output of the clock signal CKQ is enabled. The temperature sensor circuit and the output enable pad POE are disposed so as to overlap with each other in the plan view, as shown in FIG. 12. That is, the temperature sensor circuit 90 is disposed below the output enable pad POE, as in the description with reference to FIGS. 4 and 5. The region of the output enable pad POE can thus be effectively used to dispose the temperature sensor circuit 90, so that the situation in which the region of the output enable pad POE forms a dead space can be avoided. As described above, arranging the temperature sensor circuit 90 in the region of the output enable pad POE, which otherwise forms a dead space, allows reduction in the layout area of the integrated circuit apparatus 20 even when the ratio of the pad area to the total area of the integrated circuit apparatus 20 is large, whereby the size of the integrated circuit apparatus 20 can be reduced. Furthermore, when the temperature sensor circuit 90 and the output enable pad POE are disposed so as to overlap with each other in the plan view, the output enable pad POE functions as a shielding member, which suppresses the transmission of the high-frequency noise to the temperature sensor circuit 90. For example, the shielding effect provided by the output enable pad POE reduces the electromagnetic and electrostatic coupling of the output buffer circuit 50 and other components to the temperature sensor circuit 90, preventing the high-frequency noise from being superimposed on the output signal from the temperature sensor circuit 90. The shielding effect can therefore prevent a situation in which the output signal from the temperature sensor circuit 90 fluctuates due to the high-frequency noise so that proper temperature compensation is not performed and the accuracy of the clock frequency decreases. In FIG. 12, the temperature sensor circuit 90 and the output enable pad POE are disposed so as to overlap with each other, and a variation in which the temperature sensor circuit 90 and the ground pad PGND are disposed so as to overlap with each other in the plan view is conceivable. Therefore, as in the case where the temperature sensor circuit 90 and the output enable pad POE are so disposed as to overlap with each other, the layout efficiency can be improved, fluctuation of the output signal from the temperature sensor circuit 90 due to the shielding effect can be suppressed, and other advantages can be achieved.

The test circuit 92 and the interface circuit 94 in FIG. 2 may be disposed so as to overlap with the output enable pad POE in the plan view. For example, since the test circuit 92 is a circuit that tests the analog circuits and other internal circuits of the integrated circuit apparatus 20 by using the output enable pad POE, it is preferable to dispose the test circuit 92 below the output enable pad POE. Since the interface circuit 94 also uses the output enable pad POE as a serial data input/output terminal, it is preferable to dispose the interface circuit 94 below the output enable pad POE.

Figure 13:
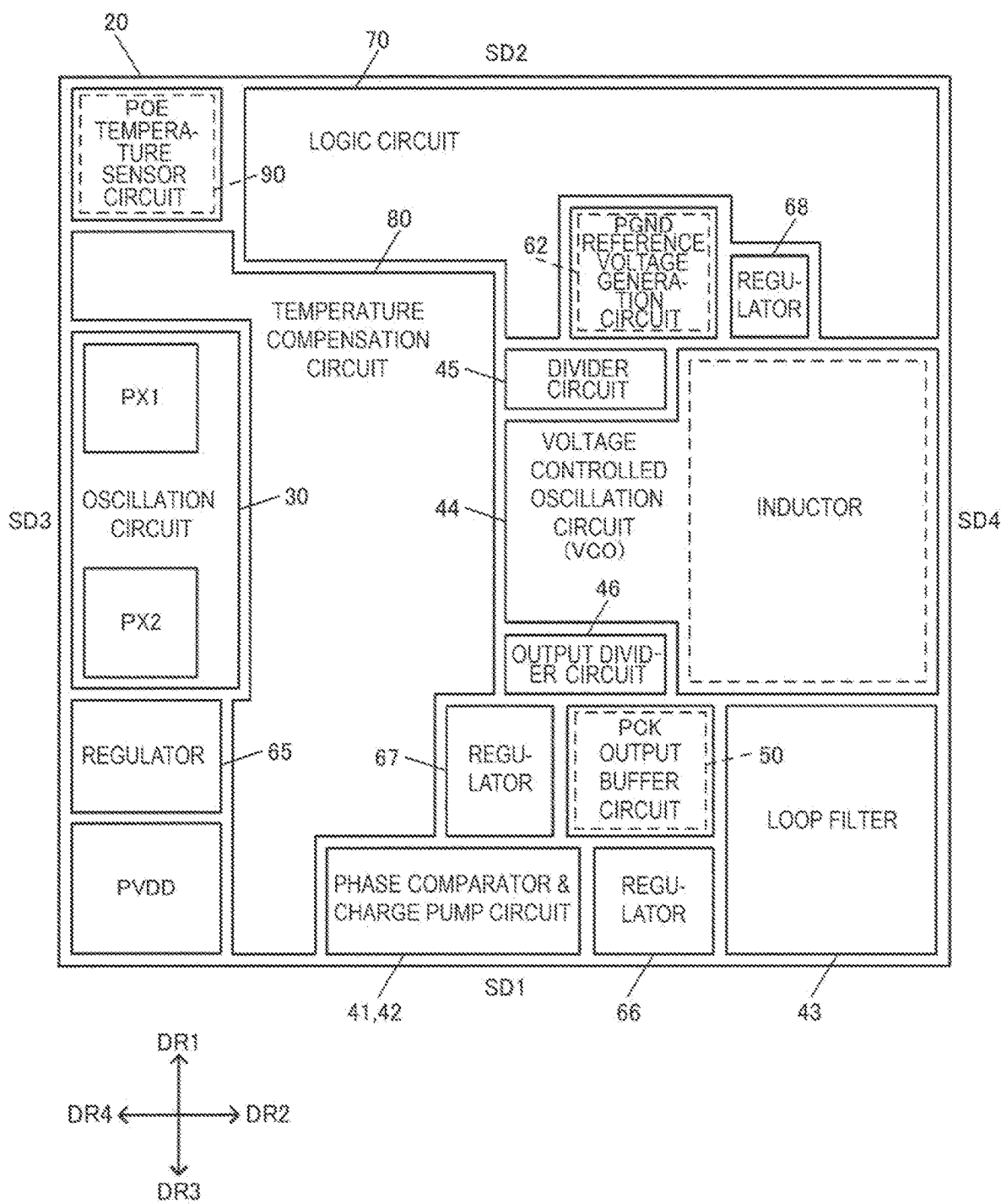
FIG. 13 shows another example of the layout of the integrated circuit apparatus according to the embodiment.

The layout of the integrated circuit apparatus 20 according to the present embodiment is not limited to the arrangement shown in FIG. 12, and the arrangement can be changed in a variety of manners. For example, FIG. 13 shows another example of the layout of the integrated circuit apparatus 20. In FIG. 13, the phase comparator 41, the charge pump circuit 42, and the loop filter 43 are disposed on the side facing the edge SD2, whereas in FIG. 12, the phase comparator 41, the charge pump circuit 42, and the loop filter 43 are disposed on the side facing the edge SD1. Furthermore, in FIG. 12, the logic circuit 70 is disposed on the side facing the edge SD1, whereas in FIG. 13, the logic circuit 70 is disposed on the side facing the edge SD2. In FIG. 12, the circuit blocks that are high-frequency noise sources are collectively disposed on the side facing the edge SD1, and the circuit blocks that are desirably free of adverse effects of the high-frequency noise are disposed on the side facing the edge SD2. The layout shown in FIG. is desirable from the viewpoint of prevention of a decrease in the accuracy of the clock frequency due to the high-frequency noise.

Figure 14:
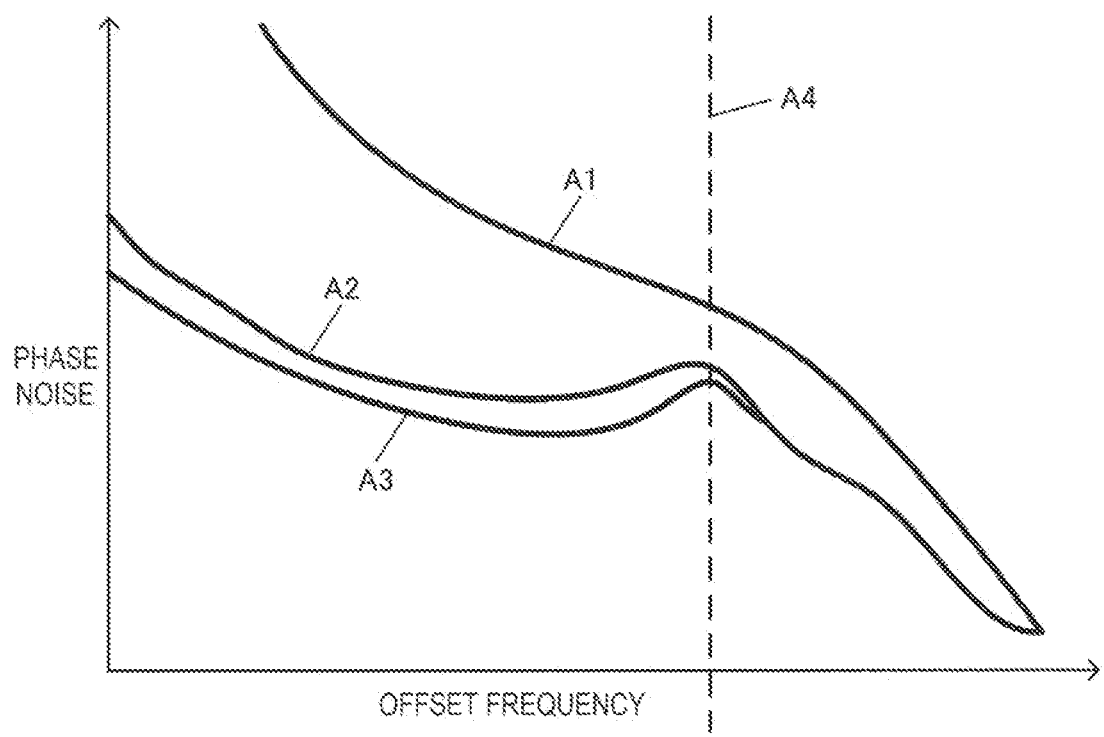
FIG. 14 describes phase noise.

For example, FIG. 14 describes phase noise. In FIG. 14, the horizontal axis represents the offset frequency, and the vertical axis represents the phase noise. A1 in FIG. 14 represents the noise characteristic of the clock signal CKQ in a case where the PLL circuit 40 is operated in free running without phase synchronization. On the other hand, A2 and A3 represent the noise characteristic of the clock signal CKQ in a case where the PLL circuit 40 performs phase synchronization with the oscillation signal OSC. Since the phase noise of the oscillation signal OSC is small, the inbound noise on the left side of the line labeled with A4 in FIG. 14 can be reduced by causing the PLL circuit 40 to perform the phase synchronization with the oscillation signal OSC. In FIG. 14, A2 represents the noise characteristic in a case where the layout in FIG. 13 is employed, and A3 represents the noise characteristic in a case where the layout in FIG. 12 is employed. As shown in FIG. 12, the output buffer circuit 50, the logic circuit 70, and other components that are high-frequency noise sources, are collectively disposed on the side facing the edge SD1, and the reference voltage generation circuit 62, the charge pump circuit 42, and other components that are desirably kept away from the high-frequency noise sources, are collectively disposed on the side facing the edge SD2, whereby the phase noise of the clock signal CKQ can be reduced as indicated by A3 in FIG. 14.

3. Oscillator

Figure 15:
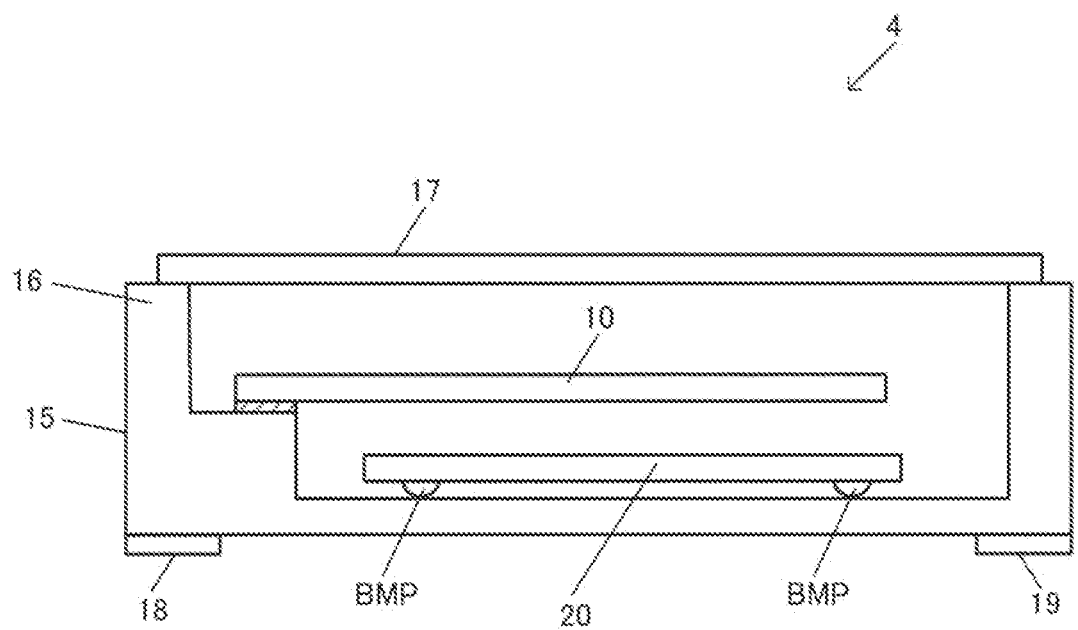
FIG. 15 shows an example of the structure of an oscillator.

FIG. 15 shows an example of the structure of the oscillator 4 according to the present embodiment. The oscillator 4 includes the resonator 10, the integrated circuit apparatus 20, and a package 15, which accommodates the resonator 10 and the integrated circuit apparatus 20. The package 15 is made, for example, of a ceramic material and has an accommodation space therein, and the resonator 10 and the integrated circuit apparatus 20 are accommodated in the accommodation space. The accommodation space is hermetically sealed and desirably under reduced pressure that is close to a vacuum. The package 15 can preferably protect the resonator 10 and the integrated circuit apparatus 20, for example, from shock, dust, heat, and moisture.

The package 15 includes a base 16 and a lid 17. Specifically, the package 15 is formed of the base 16, which supports the resonator 10 and the integrated circuit apparatus 20, and the lid 17, which is joined to the upper surface of the base 16 to form the accommodation space between the lid 17 and the base 16. The resonator 10 is supported via terminal electrodes by a step provided as an inner portion of the base 16. The integrated circuit apparatus 20 is disposed at the inner bottom surface of the base 16. Specifically, the integrated circuit apparatus 20 is so disposed that the active surface thereof faces the inner bottom surface of the base 16. The active surface is the surface where the circuit elements of the integrated circuit apparatus 20 are formed. Bumps BMP are formed at pads of the integrated circuit apparatus 20 that are the terminals thereof. The integrated circuit apparatus 20 is supported by the inner bottom surface of the base 16 via the electrically conductive bumps BMP. The electrically conductive bumps BMP are, for example, metal bumps, and the resonator 10 and the integrated circuit apparatus 20 are electrically coupled to each other via the bumps BMP and internal wiring, terminal electrodes, and other components of the package 15. The integrated circuit apparatus 20 is electrically coupled to external terminals 18 and 19, which are external coupling terminals of the oscillator 4, via the bumps BMP and the internal wiring of the package 15. The external terminals 18 and 19 are formed at the outer bottom surface of the package 15. The external terminals 18 and 19 are coupled to an external device via external wiring. The external wiring is, for example, wiring formed in a circuit substrate on which the external device is mounted. The clock signal and other information can thus be outputted to the external device.

In FIG. 15, the integrated circuit apparatus 20 is flip-mounted so that the active surface thereof faces downward, but the present embodiment does not necessarily employ mounting of this type. For example, the integrated circuit apparatus 20 may be so mounted that the active surface thereof faces upward. That is, the integrated circuit apparatus 20 is so mounted that the active surface thereof faces the resonator 10. The oscillator 4 can instead be a wafer-level-package (WLP) oscillator. In this case, the oscillator 4 includes a semiconductor substrate, a base including a through electrode passing through the portion between a first surface and a second surface of the semiconductor substrate, the resonator 10 fixed to the first surface of the semiconductor substrate via an electrically conductive bonding member, such as metal bumps, and an external terminal provided at the side facing the second surface of the semiconductor substrate via an insulating layer, such as a rearranged wiring layer. An integrated circuit that forms the integrated circuit apparatus 20 is then formed at the first or second surface of the semiconductor substrate. In this case, a first semiconductor wafer in which a plurality of bases in each of which the resonator 10 and the integrated circuit are disposed are formed and a second semiconductor wafer in which a plurality of lids are formed are bonded to each other so that the plurality of bases and the plurality of lids are joined to each other, followed by individualization of the oscillators 4, for example, by using a dicing saw. The oscillators 4 in the form of a wafer-level package can thus be achieved and manufactured at high throughput and low cost.

As described above, the integrated circuit apparatus according to the present embodiment includes an oscillation circuit that generates an oscillation signal by using a resonator, an output buffer circuit that outputs a clock signal based on the oscillation signal, a DC voltage generation circuit that generates a DC voltage used to generate the oscillation signal or the clock signal, a power source pad to which a power source voltage is supplied, a ground pad to which a ground voltage is supplied, and a clock pad via which the clock signal is outputted. The ground pad and the DC voltage generation circuit are disposed so as to overlap with each other in the plan view.

According to the present embodiment, the power source voltage and the ground voltage are supplied to the integrated circuit apparatus via the power source pad and the ground pad, the oscillation circuit uses the resonator to generate the oscillation signal, and the output buffer circuit outputs the clock signal based on the oscillation signal via the clock pad. The DC voltage generation circuit, which generates the DC voltage used to generate the oscillation signal or the clock signal, and the ground pad are disposed so as to overlap with each other in the plan view. The ground pad therefore functions as a shielding member, so that the transmission of the high-frequency noise to the DC voltage generation circuit can be suppressed, whereby a decrease in the accuracy of the clock frequency and other problems due to the high-frequency noise can be avoided. Furthermore, since the reference voltage generation circuit can be disposed by effectively using the region of the ground pad, which otherwise forms a dead space, the reference voltage generation circuit can be efficiently laid out, whereby the size of the integrated circuit apparatus can be reduced. As described above, the present embodiment can provide an integrated circuit apparatus and the like that can both prevent a decrease in the accuracy of the clock frequency based, for example, on the shielding effect provided by the ground pad and effectively use the pad region for an efficient layout.

In the present embodiment, the clock pad and the output buffer circuit may be disposed so as to overlap with each other in the plan view.

The clock signal from the output buffer circuit can therefore be outputted to the clock pad located immediately thereabove in a short clock wiring path from the output buffer circuit toward the clock pad. The impedance of the clock wiring can therefore be minimized, so that the potential fluctuation caused by the impedance can be suppressed. Furthermore, since the output buffer circuit and the clock pad, which are high-frequency noise sources, can be collectively disposed at a single location, a layout and other measures for reducing the adverse effects of noise from the high-frequency noise sources can be readily achieved.

In the present embodiment, the DC voltage generation circuit may be a reference voltage generation circuit that generates a reference voltage for generating at least one of a bias current, a bias voltage, and a regulated power source voltage.

The shielding effect provided by the ground pad therefore reduces the electromagnetic and electrostatic coupling of the output buffer circuit and the clock pad to the reference voltage generation circuit, preventing the high-frequency noise from being superimposed on the reference voltage outputted by the reference voltage generation circuit.

In the present embodiment, the DC voltage generation circuit may be a regulator that generates a regulated power source voltage based on the power source voltage.

The shielding effect provided by the ground pad can thus prevent the high-frequency noise from being superimposed on the regulated power source voltage outputted by the regulator, preventing the accuracy of the clock frequency from decreasing due to the high-frequency noise.

In the present embodiment, the integrated circuit apparatus may further include a PLL circuit that performs a PLL operation for generating the clock signal phase-locked to the oscillation signal. The PLL circuit may include a phase comparator, a charge pump circuit, and a loop filter. The DC voltage generation circuit may be the charge pump circuit, the loop filter, or a regulator that supplies the charge pump circuit with a regulated power source voltage.

The shielding effect provided by the ground pad can thus prevent the high-frequency noise from being superimposed on the output voltage from the charge pump circuit, the loop filter, or the regulator, preventing the accuracy of the clock frequency from decreasing due to the high-frequency noise.

In the present embodiment, the external shape of the integrated circuit apparatus may have a first edge and a second edge facing the first edge, with the output buffer circuit and the clock pad disposed on the side facing the first edge, and the DC voltage generation circuit and the ground pad disposed on the side facing the second edge.

The distance from the output buffer circuit and the clock pad, which are high-frequency noise sources, to the DC voltage generation circuit and the ground pad can thus be increased, whereby the transmission of the high-frequency noise from the output buffer circuit and the clock pad to the DC voltage generation circuit and the ground pad can be suppressed.

In the present embodiment, the integrated circuit apparatus may further include a PLL circuit that performs a PLL operation for generating the clock signal phase-locked to the oscillation signal, and the DC voltage generation circuit may be a reference voltage generation circuit that generates a reference voltage used in the operation of the PLL circuit.

Providing the PLL circuit allows output of a clock signal phase-locked to the oscillation signal and having a frequency set at a desired value. The reference voltage generation circuit, which generates the reference voltage necessary for the operation of the PLL circuit, is disposed so as to overlap with the ground pad in the plan view, whereby a decrease in the accuracy of the clock frequency caused by the high-frequency noise can be avoided.

In the present embodiment, the PLL circuit may include a phase comparator, a charge pump circuit, and a loop filter, and the charge pump circuit may be provided on the side facing the second edge.

The charge pump circuit, the reference voltage generation circuit, and the ground pad can thus be collectively disposed at a distance far from the output buffer circuit and the clock pad disposed on the side facing the first edge, whereby the transmission of the high-frequency noise from the output buffer circuit and the clock pad to the charge pump circuit and other components can be suppressed.

In the present embodiment, the loop filter may be provided on the side facing the second edge.

The loop filter, the reference voltage generation circuit, the ground pad, and other components can thus be collectively disposed at a distance far from the output buffer circuit and the clock pad disposed on the side facing the first edge, whereby the transmission of the high-frequency noise from the output buffer circuit and the clock pad to the loop filter and other components can be suppressed.

In the present embodiment, the integrated circuit apparatus may include a regulator that supplies the charge pump circuit with a regulated power source voltage generated based on the reference voltage, and the regulator may be provided on the side facing the second edge.

The distance between the regulator and high-frequency noise sources, such as the output buffer circuit, can thus be increased, suppressing superimposition of the high-frequency noise on the regulated power source voltage and preventing a decrease in the accuracy of the clock frequency.

In the present embodiment, the integrated circuit apparatus may further include a logic circuit that controls the PLL circuit, and the logic circuit may be provided on the side facing the first edge.

The logic circuit is thus also disposed along with the output buffer circuit and other components on the side facing the first edge. The distance from the reference voltage generation circuit and other components disposed on the side facing the first edge to the logic circuit, the output buffer circuit, and other components that are high-frequency noise sources can be increased, whereby a decrease in the accuracy of the clock frequency caused by the high-frequency noise can be avoided.

In the present embodiment, the PLL circuit may include a voltage controlled oscillation circuit, and the voltage controlled oscillation circuit may be provided between the clock pad and the ground pad.

The voltage controlled oscillation circuit can thus be disposed by effectively using the region between the clock pad and the ground pad and can therefore be efficiently laid out.

In the present embodiment, the outer shape of the integrated circuit apparatus may have a third edge that intersects with the first and second edges, and the oscillation circuit may be provided on the side facing the third edge.

The distance from the output buffer circuit and other components disposed on the side facing the first edge to the oscillation circuit can thus be increased, preventing the situation in which the high-frequency noise from the output buffer circuit is superimposed on the oscillation signal so that the oscillation characteristics deteriorate. Furthermore, the distance from the reference voltage generation circuit and other components disposed on the side facing the second edge to the oscillation circuit can be increased, preventing the situation in which the oscillation noise from the oscillation circuit is superimposed on the reference voltage from the reference voltage generation circuit and other voltages so that the accuracy of the clock frequency decreases.

In the present embodiment, the integrated circuit apparatus may further include a temperature compensation circuit that performs temperature compensation on the oscillation frequency of the oscillation signal, and the temperature compensation circuit may be provided between the oscillation circuit and the set of the clock pad and the ground pad.

The temperature compensation circuit can thus be disposed by effectively using the region between the oscillation circuit and the set of the clock pad and the ground pad and can be efficiently laid out.

In the present embodiment, the integrated circuit apparatus may further include a temperature sensor circuit that detects the temperature, a temperature compensation circuit that performs temperature compensation on the oscillation frequency of the oscillation signal based on the output from the temperature sensor circuit, and an output enable pad for controlling whether the output of the clock signal is enabled. The temperature sensor circuit and the output enable pad or the ground pad may be disposed so as to overlap with each other in the plan view.

The shielding effect provided by the output enable pad or the ground pad reduces the electromagnetic and electrostatic coupling of the output buffer circuit and other components to the temperature sensor circuit, preventing the high-frequency noise from being superimposed on the output signal from the temperature sensor circuit.

The present embodiment also relates to an oscillator including the integrated circuit apparatus described above and a resonator.

The present embodiment has been described above in detail, and a person skilled in the art will readily appreciate that a large number of variations are conceivable to the extent that they do not substantially depart from the novel items and effects of the present disclosure. Such variations are all therefore assumed to fall within the scope of the present disclosure. For example, a term described at least once in the specification or the drawings along with a different term having a broader meaning or the same meaning can be replaced with the different term anywhere in the specification or the drawings. Furthermore, all combinations of the present embodiment and the variations fall within the scope of the present disclosure. Moreover, the configuration, operation, and other factors of each of the integrated circuit apparatus and the oscillator are not limited to those described in the present embodiment and can be changed in a variety of manners.

What is claimed is:

1. An integrated circuit apparatus comprising:
   an oscillation circuit that generates an oscillation signal by using a resonator;
   an output buffer circuit that outputs a clock signal based on the oscillation signal;
   a DC voltage generation circuit that generates a DC voltage used to generate the oscillation signal or the clock signal;
   a power source pad to which a power source voltage is supplied;
   a ground pad to which a ground voltage is supplied; and
   a clock pad via which the clock signal is outputted,
   wherein the ground pad and the DC voltage generation circuit are disposed so as to overlap with each other in a plan view.

2. The integrated circuit apparatus according to claim 1, wherein the clock pad and the output buffer circuit are disposed so as to overlap with each other in the plan view.

3. The integrated circuit apparatus according to claim 1, wherein the DC voltage generation circuit is a reference voltage generation circuit that generates a reference voltage for generating at least one of a bias current, a bias voltage, and a regulated power source voltage.

4. The integrated circuit apparatus according to claim 1, wherein the DC voltage generation circuit is a regulator that generates a regulated power source voltage based on the power source voltage.

5. The integrated circuit apparatus according to claim 1, further comprising a PLL circuit that performs a PLL operation for generating the clock signal phase-locked to the oscillation signal,
   wherein the PLL circuit includes a phase comparator, a charge pump circuit, and a loop filter, and
   the DC voltage generation circuit is the charge pump circuit, the loop filter, or a regulator that supplies the charge pump circuit with a regulated power source voltage.

6. The integrated circuit apparatus according to claim 1, wherein an external shape of the integrated circuit apparatus has a first edge and a second edge facing the first edge,
   the output buffer circuit and the clock pad are disposed on a side facing the first edge, and
   the DC voltage generation circuit and the ground pad are disposed on a side facing the second edge.

7. The integrated circuit apparatus according to claim 6, further comprising a PLL circuit that performs a PLL operation for generating the clock signal phase-locked to the oscillation signal,
   wherein the DC voltage generation circuit is a reference voltage generation circuit that generates a reference voltage used in an operation of the PLL circuit.

8. The integrated circuit apparatus according to claim 7, wherein the PLL circuit includes a phase comparator, a charge pump circuit, and a loop filter, and
   the charge pump circuit is provided on the side facing the second edge.

9. The integrated circuit apparatus according to claim 8, wherein the loop filter is provided on the side facing the second edge.

10. The integrated circuit apparatus according to claim 8, further comprising a regulator that supplies the charge pump circuit with a regulated power source voltage generated based on the reference voltage, and
    wherein the regulator is provided on the side facing the second edge.

11. The integrated circuit apparatus according to claim 7, further comprising a logic circuit that controls the PLL circuit,
    wherein the logic circuit is provided on the side facing the first edge.

12. The integrated circuit apparatus according to claim 7, wherein the PLL circuit includes a voltage controlled oscillation circuit, and
    the voltage controlled oscillation circuit is provided between the clock pad and the ground pad.

13. The integrated circuit apparatus according to claim 1, wherein the outer shape of the integrated circuit apparatus has a third edge that intersects with the first and second edges, and
    the oscillation circuit is provided on a side facing the third edge.

14. The integrated circuit apparatus according to claim 1, further comprising a temperature compensation circuit that performs temperature compensation on an oscillation frequency of the oscillation signal, and
    the temperature compensation circuit is provided between the oscillation circuit and a set of the clock pad and the ground pad.

15. The integrated circuit apparatus according to claim 1, further comprising
    a temperature sensor circuit that detects a temperature;
    a temperature compensation circuit that performs temperature compensation on an oscillation frequency of the oscillation signal based on an output from the temperature sensor circuit, and
    an output enable pad for controlling whether the output of the clock signal is enabled,
    wherein the temperature sensor circuit and the output enable pad or the ground pad is disposed so as to overlap with each other in the plan view.

16. An oscillator comprising:
    the integrated circuit apparatus according to claim 1; and
    a resonator.

* * * * *